(12) United States Patent
Hane et al.

(10) Patent No.: US 10,344,382 B2
(45) Date of Patent: Jul. 9, 2019

(54) FILM FORMING APPARATUS

(71) Applicant: TOKYO ELECTRON LIMITED, Tokyo (JP)

(72) Inventors: Hideomi Hane, Oshu (JP); Takahito Umehara, Oshu (JP); Takehiro Kasama, Oshu (JP); Tsubasa Watanabe, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 430 days.

(21) Appl. No.: 14/707,663

(22) Filed: May 8, 2015

(65) Prior Publication Data

US 2015/0329964 A1 Nov. 19, 2015

(30) Foreign Application Priority Data

May 16, 2014 (JP) ................................ 2014-102782

(51) Int. Cl.
*C23C 16/44* (2006.01)
*C23C 16/455* (2006.01)

(52) U.S. Cl.
CPC .... *C23C 16/45591* (2013.01); *C23C 16/4405* (2013.01); *C23C 16/4412* (2013.01);
(Continued)

(58) Field of Classification Search
CPC ............ C23C 16/4405; C23C 16/4412; C23C 16/45519; C23C 16/45523;
(Continued)

(56) References Cited

U.S. PATENT DOCUMENTS 6,187,102 B1 * 2/2001 Yamamoto .......... C23C 16/4401
 118/725
6,475,286 B1 * 11/2002 Frijlink ............... C23C 16/4401
 118/715
(Continued)

FOREIGN PATENT DOCUMENTS

CN 102994981 A 3/2013
JP 2011100956 A 5/2011
(Continued)

*Primary Examiner* — Jeffrie R Lund
*Assistant Examiner* — Stanislav Antolin
(74) *Attorney, Agent, or Firm* — Nath, Goldberg & Meyer; Jerald L. Meyer

(57) ABSTRACT

There is provided a film forming apparatus including a raw material gas nozzle provided with gas discharge holes for discharging a mixed gas of a raw material gas and a carrier gas; a flow regulating plate portion extended along the longitudinal direction of the raw material gas nozzle; a central region configured to supply a separating gas from a center side within a vacuum container toward a substrate loading surface of a rotary table; a protuberance portion protruded from the flow regulating plate portion toward the rotary table at a position shifted toward a center side of the rotary table from the gas discharge holes; and a protuberance portion configured to restrain the separating gas from flowing between the flow regulating plate portion and the rotary table; and an exhaust port configured to vacuum exhaust the interior of the vacuum container.

10 Claims, 17 Drawing Sheets

(52) U.S. Cl.
CPC .. *C23C 16/45519* (2013.01); *C23C 16/45544* (2013.01); *C23C 16/45551* (2013.01); *C23C 16/45578* (2013.01)

(58) Field of Classification Search
CPC ........ C23C 16/45544; C23C 16/45551; C23C 16/45563; C23C 16/45578; C23C 16/45591; C23C 16/458; C23C 16/4584; C23C 16/45508; C23C 16/45525; C23C 16/45548; C23C 16/45561; C23C 16/45565; C23C 16/45574; C23C 16/45587; C23C 16/45589; C23C 16/4585; C23C 16/4586; C23C 16/54; C30B 25/14; C30B 25/165; H01J 2237/332; H01J 37/3244; H01J 37/32449; H01J 37/32715; H01J 37/32733; H01J 37/32779; H01L 21/02104; H01L 21/02263; H01L 21/0228; H01L 21/28556; H01L 21/67161; H01L 21/6719; H01L 21/67207; H01L 21/68764; H01L 21/68771
See application file for complete search history.

(56) References Cited

U.S. PATENT DOCUMENTS

| | | | | |
|---|---|---|---|---|
| D654,882 S * | 2/2012 | Honma | | D13/182 |
| D654,883 S * | 2/2012 | Honma | | D13/182 |
| D655,257 S * | 3/2012 | Honma | | D13/182 |
| D655,259 S * | 3/2012 | Honma | | D13/182 |
| D655,260 S * | 3/2012 | Honma | | D13/182 |
| D655,261 S * | 3/2012 | Honma | | D13/182 |
| 8,187,679 B2 * | 5/2012 | Dickey | | C23C 16/452 427/569 |
| 8,721,790 B2 * | 5/2014 | Kato | | C23C 16/4412 118/715 |
| 8,808,456 B2 * | 8/2014 | Kato | | C23C 16/401 118/716 |
| 8,882,915 B2 * | 11/2014 | Kato | | C23C 16/402 118/715 |
| 8,882,916 B2 * | 11/2014 | Kumagai | | C23C 16/45536 118/719 |
| 8,906,246 B2 * | 12/2014 | Kato | | H01L 21/02164 156/345.44 |
| 8,927,440 B2 * | 1/2015 | Kato | | H01L 21/0228 118/696 |
| 8,944,077 B2 * | 2/2015 | Kato | | B08B 7/0035 118/70 |
| 8,951,347 B2 * | 2/2015 | Kato | | C23C 16/45519 118/715 |
| 8,992,685 B2 * | 3/2015 | Kato | | H01L 21/67109 118/719 |
| 9,062,373 B2 * | 6/2015 | Kato | | C23C 16/4412 |
| 9,093,490 B2 * | 7/2015 | Kato | | C23C 16/402 |
| 9,136,156 B2 * | 9/2015 | Enomoto | | H01L 21/6719 |
| 9,209,011 B2 * | 12/2015 | Kato | | H01L 21/0206 |
| 9,267,204 B2 * | 2/2016 | Honma | | C23C 16/45551 |
| 9,435,026 B2 * | 9/2016 | Wamura | | C23C 16/4401 |
| 9,453,280 B2 * | 9/2016 | Kato | | C23C 16/345 |
| 9,677,174 B2 * | 6/2017 | Kumagai | | C23C 16/45536 |
| 2008/0026162 A1 * | 1/2008 | Dickey | | C23C 16/452 427/569 |
| 2009/0324826 A1 * | 12/2009 | Kato | | C23C 16/402 427/255.28 |
| 2009/0324828 A1 * | 12/2009 | Kato | | C23C 16/402 427/255.28 |
| 2010/0050942 A1 * | 3/2010 | Kato | | C23C 16/401 118/730 |
| 2010/0055316 A1 * | 3/2010 | Honma | | C23C 16/45551 427/255.28 |
| 2010/0055347 A1 * | 3/2010 | Kato | | C23C 16/452 427/569 |
| 2010/0055351 A1 * | 3/2010 | Kato | | C23C 16/45521 427/595 |
| 2010/0116210 A1 * | 5/2010 | Kato | | C23C 16/4584 118/730 |
| 2010/0122710 A1 * | 5/2010 | Kato | | B08B 7/0035 134/1 |
| 2010/0199914 A1 * | 8/2010 | Iza | | C23C 16/4584 118/725 |
| 2010/0229797 A1 * | 9/2010 | Kato | | C23C 16/402 118/730 |
| 2010/0260935 A1 * | 10/2010 | Kato | | C23C 16/402 427/255.28 |
| 2010/0260936 A1 * | 10/2010 | Kato | | H01L 21/67109 427/255.28 |
| 2010/0310771 A1 * | 12/2010 | Lee | | C23C 16/32 427/255.28 |
| 2011/0039026 A1 * | 2/2011 | Kato | | C23C 16/402 427/255.26 |
| 2011/0139074 A1 * | 6/2011 | Kato | | C23C 16/4412 118/730 |
| 2011/0155056 A1 * | 6/2011 | Kato | | C23C 16/45538 118/719 |
| 2011/0155057 A1 * | 6/2011 | Kato | | C23C 16/45519 118/719 |
| 2011/0155062 A1 * | 6/2011 | Kato | | C23C 16/45519 118/728 |
| 2011/0159187 A1 * | 6/2011 | Kato | | C23C 16/45544 427/255.26 |
| 2011/0159188 A1 * | 6/2011 | Kato | | C23C 16/34 427/255.394 |
| 2011/0214611 A1 * | 9/2011 | Kato | | C23C 16/45519 118/719 |
| 2011/0236598 A1 * | 9/2011 | Kumagai | | C23C 16/45536 427/569 |
| 2012/0021252 A1 * | 1/2012 | Lee | | C23C 16/45534 428/702 |
| 2012/0052693 A1 * | 3/2012 | Ozaki | | C23C 16/402 438/771 |
| 2012/0094011 A1 * | 4/2012 | Hishiya | | C23C 16/45548 427/8 |
| 2012/0222615 A1 * | 9/2012 | Kato | | H01L 21/68764 118/719 |
| 2012/0267341 A1 * | 10/2012 | Kato | | H01L 21/02164 216/37 |
| 2013/0042813 A1 * | 2/2013 | Kato | | C23C 16/45578 118/730 |
| 2013/0047923 A1 * | 2/2013 | Kato | | H01L 21/02164 118/723 AN |
| 2013/0059415 A1 * | 3/2013 | Kato | | C23C 16/345 438/106 |
| 2013/0061804 A1 * | 3/2013 | Enomoto | | H01L 21/6719 118/719 |
| 2013/0074770 A1 * | 3/2013 | Honma | | C23C 16/401 118/719 |
| 2013/0149467 A1 * | 6/2013 | Kato | | C23C 16/4554 427/569 |
| 2013/0180452 A1 * | 7/2013 | Kato | | C23C 16/458 118/719 |
| 2013/0203268 A1 * | 8/2013 | Kato | | H01L 21/02263 438/778 |
| 2013/0206067 A1 * | 8/2013 | Kato | | H01L 21/02104 118/719 |
| 2014/0011370 A1 * | 1/2014 | Kato | | H01L 21/0206 438/782 |
| 2014/0017905 A1 * | 1/2014 | Kato | | H01L 21/0228 438/782 |
| 2014/0213068 A1 * | 7/2014 | Kato | | C23C 16/45544 438/765 |
| 2014/0290578 A1 * | 10/2014 | Wamura | | C23C 16/4401 118/725 |
| 2015/0184294 A1 * | 7/2015 | Kato | | C23C 16/34 118/697 |
| 2015/0200110 A1 * | 7/2015 | Li | | H01L 21/31144 438/696 |

(56) References Cited

U.S. PATENT DOCUMENTS

FOREIGN PATENT DOCUMENTS

| JP | 2014017322 A | * | 1/2014 | ......... H01L 21/0206 |
| --- | --- | --- | --- | --- |
| KR | 20130023114 A | | 3/2013 | |
| KR | 20130085008 A | | 7/2013 | |

\* cited by examiner

Example 1 (concentration distribution)

Example 1 (Si-containing gas mass ratio)

Comparative example 1 (concentration distribution)

Comparative example 1 (mass ratio)

Si-containing gas mass ratio

High / Low

Comparative example 2 (concentration distribution)

Si-containing gas concentration

High / Low

FILM FORMING APPARATUS

CROSS-REFERENCE TO RELATED APPLICATION

This application claims the benefit of Japanese Patent Application No. 2014-102782, filed on May 16, 2014, in the Japan Patent Office, the disclosure of which is incorporated herein in its entirety by reference.

TECHNICAL FIELD

The present disclosure relates to a film forming apparatus which forms a film by rotating a rotary table within a vacuum container and causing a substrate loaded on the rotary table to sequentially pass through a supply region of a raw material gas and a supply region of a reaction gas reacting with a raw material such that the raw material is adsorbed onto the substrate and is reacted with the reaction gas.

BACKGROUND

A film forming apparatus which implements a so-called ALD (Atomic Layer Deposition) method as a method of forming a thin film such as a silicon oxide film or the like on a substrate such as a semiconductor wafer or the like (hereinafter referred to as "wafer") is known. As the apparatus for implementing the ALD method, an apparatus is known in which a plurality of wafers disposed on a rotary table within a vacuum container is revolved by the rotary table such that the wafers sequentially pass through a supply region of a raw material gas and a supply region of a reaction gas reacting with the raw material gas. In this apparatus, the raw material gas is supplied by a gas nozzle which extends in the radial direction of the rotary table and which has gas discharge holes formed along the longitudinal direction of the gas nozzle. A baffle plate is installed above the gas nozzle to increase the efficiency of adsorption of the raw material gas onto the wafers.

A nitrogen gas as a carrier gas is supplied together with the raw material gas from the gas nozzle. Due to the flow rate of the carrier gas, the discharge amount of the raw material gas varies along the longitudinal direction of the gas nozzle. For that reason, there is a need to set the flow rate of the carrier gas at a suitable value and to regulate the gas concentration in the longitudinal direction of the gas nozzle, thereby securing good in-plane uniformity. The control of in-plane uniformity of a film thickness through the regulation of the flow rate of the carrier gas is also performed when starting up the apparatus or when re-assembling the apparatus after maintenance. However, the apparatus mentioned above poses a problem in that the flow rate range of the carrier gas for the securement of high in-plane uniformity is narrow and the calibration of the flow rate of the carrier gas between apparatuses and before and after maintenance is difficult to perform, which makes regulation troublesome.

SUMMARY

Some embodiments of the present disclosure include a film forming apparatus, which can secure good in-plane uniformity over a wide range of carrier gas flow rates and can facilitate regulation of in-plane uniformity when supplying a raw material gas and a carrier gas from a raw material gas nozzle and regulating the in-plane uniformity of a film thickness using the flow rate of the carrier gas.

According to one embodiment of the present disclosure, there is provided a film forming apparatus for forming a film by rotating a rotary table within a vacuum container and causing a substrate loaded on the rotary table to sequentially pass through a supply region of a raw material gas and a supply region of a reaction gas reacting with a raw material such that the raw material is adsorbed onto the substrate and is reacted with the reaction gas, the film forming apparatus including: a raw material gas nozzle fixedly installed above the rotary table and provided with gas discharge holes, which intersect a rotation direction of the rotary table and discharge a mixed gas of the raw material gas and the carrier gas, the gas discharge holes formed along a longitudinal direction of the raw material gas nozzle; a flow regulating plate portion extended along the longitudinal direction of the raw material gas nozzle at rotation-direction upstream and downstream sides of the raw material gas nozzle; a central region configured to supply a separating gas from a center side within the vacuum container toward a substrate loading surface of the rotary table in order to separate the supply region of the raw material gas and the supply region of the reaction gas from each other; a protuberance portion configured to restrain the separating gas from flowing between the flow regulating plate portion and the rotary table, the protuberance portion protruding from the flow regulating plate portion toward the rotary table at a position shifted toward a center side of the rotary table from the gas discharge holes of the raw material gas nozzle; and an exhaust port configured to vacuum exhaust the interior of the vacuum container.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
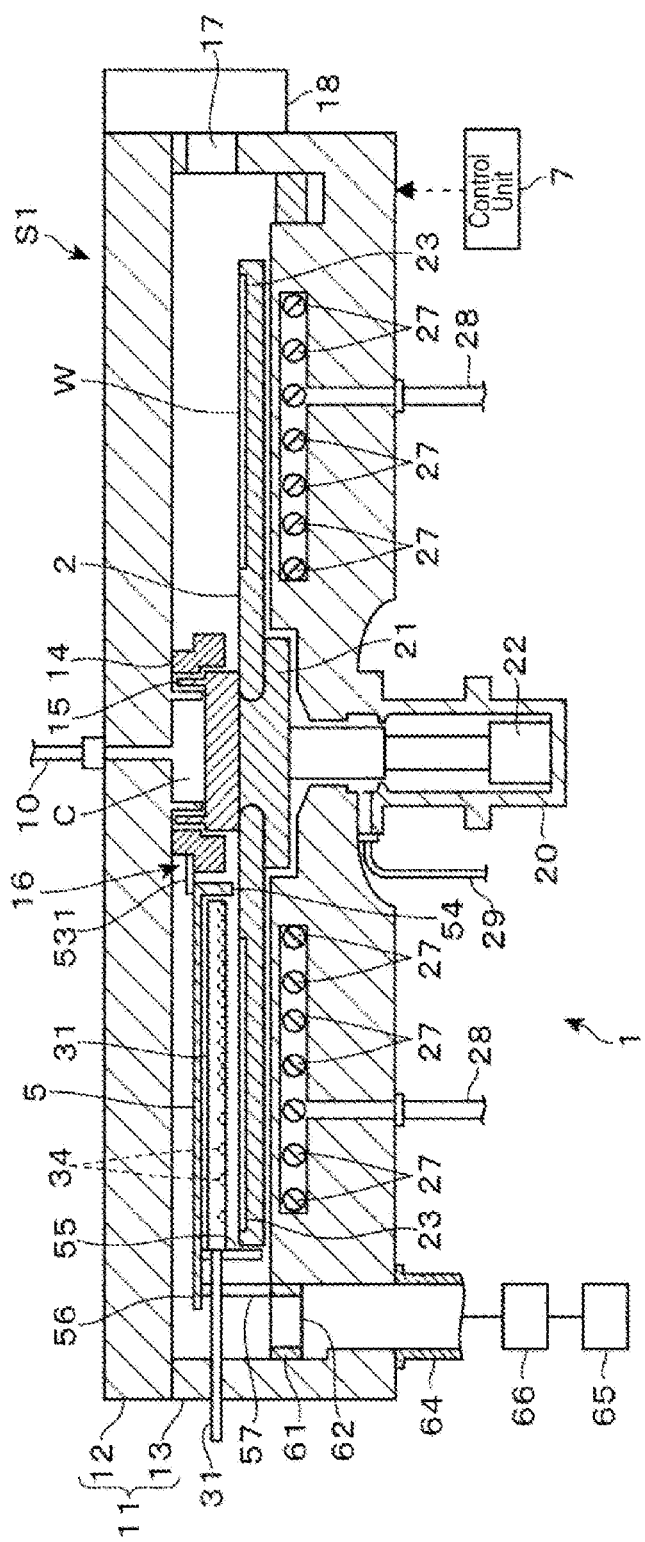
FIG. 1 is a vertical sectional side view of a film forming apparatus according to the present disclosure.
Figure 2:
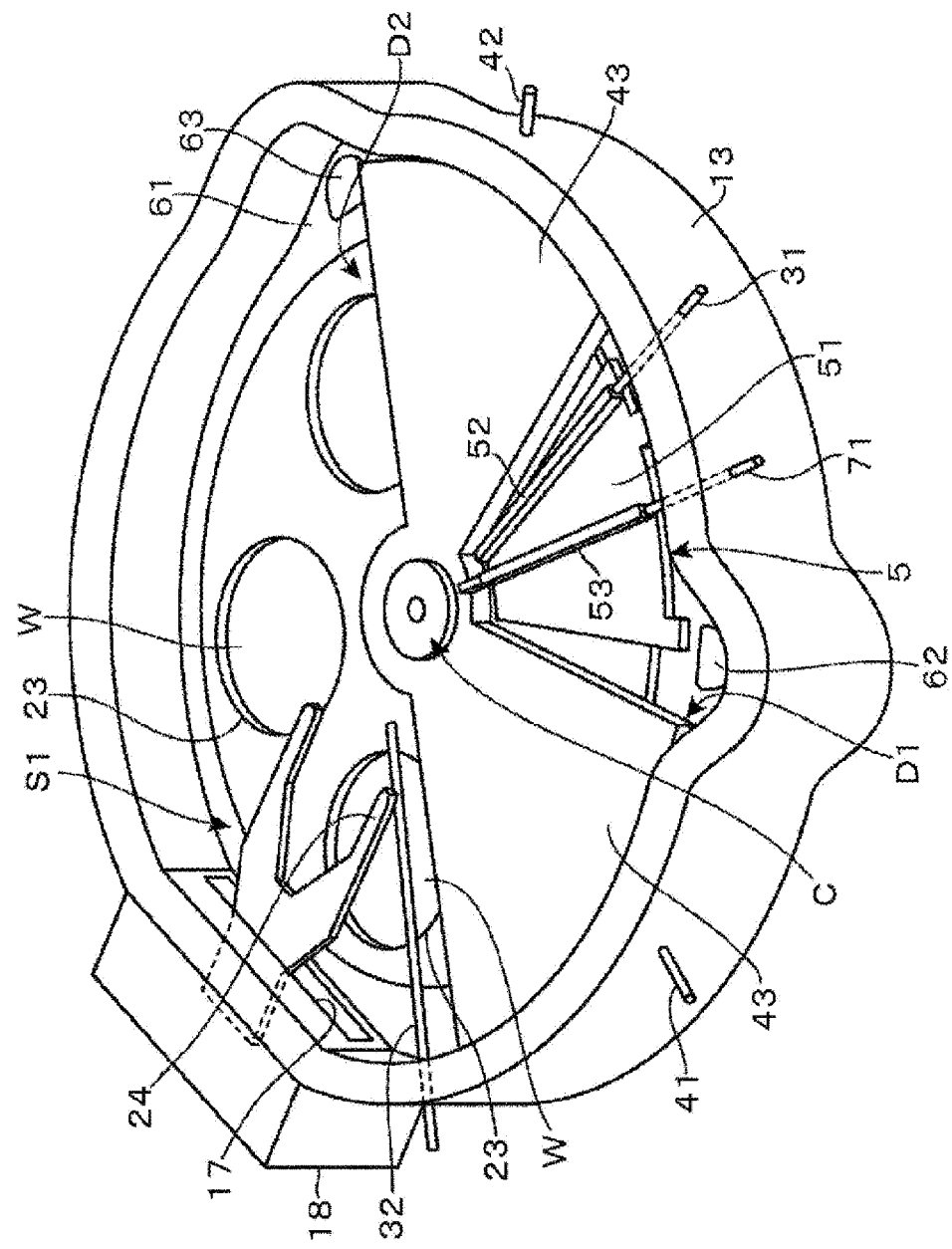
FIG. 2 is a horizontal sectional perspective view of the film forming apparatus.
Figure 3:
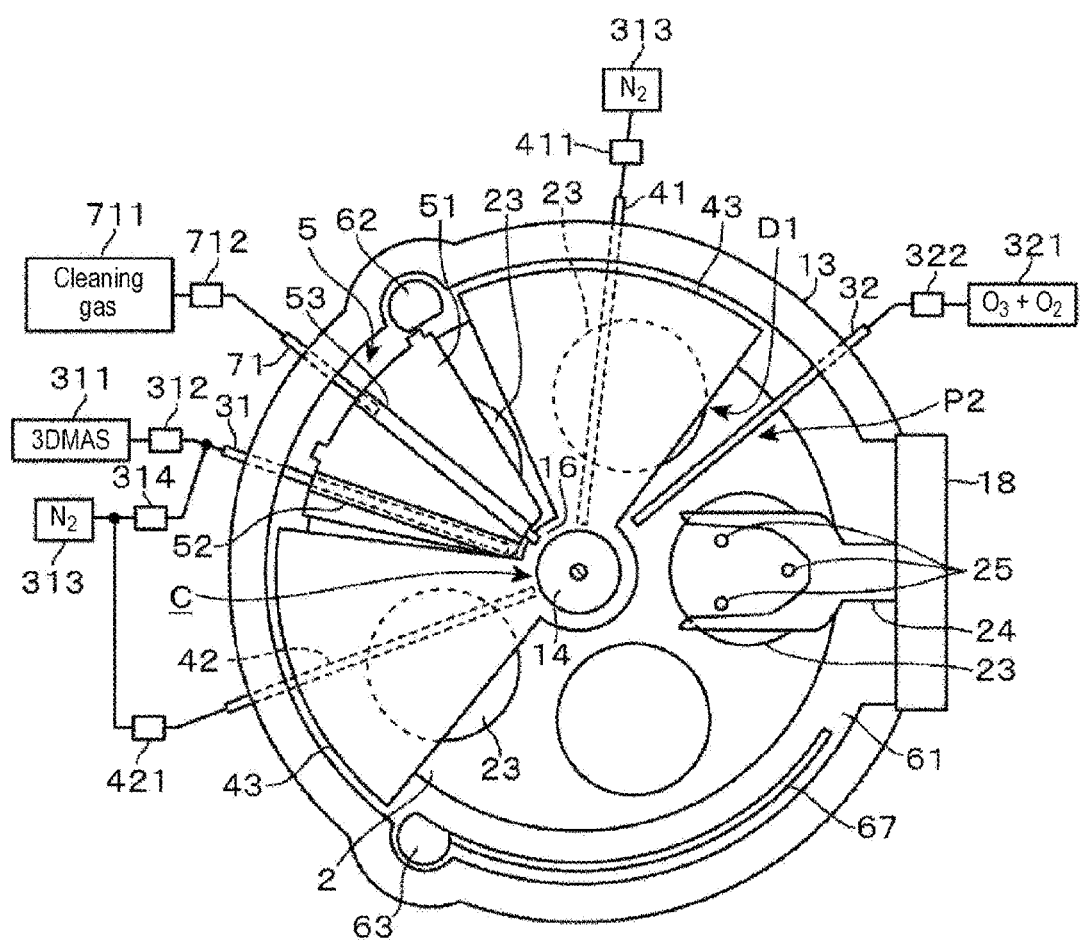
FIG. 3 is a horizontal sectional plane view of the film forming apparatus.

A film forming apparatus 1 according to an embodiment of the present disclosure will now be described with reference to FIGS. 1 to 3. FIG. 1 is a vertical sectional side view of the film forming apparatus 1. FIG. 2 is a schematic sectional perspective view of the film forming apparatus 1. FIG. 3 is a horizontal sectional plane view of the film forming apparatus 1. The film forming apparatus 1 is configured to laminate and form a thin layer of a silicon oxide film (silicon oxide) with a so-called ALD method by sequentially supplying a raw material gas and a reaction gas reacting with a raw material to wafers W. The wafers W are loaded on a rotary table 2 installed within a vacuum container 11 constituting the film forming apparatus 1. The wafers W sequentially pass through a supply region of the raw material gas and a supply region of the reaction gas such that the formation of the thin layer is repeatedly performed. Thus, a film having a desired thickness is formed on the wafers W.

The vacuum container 11 is installed in an air atmosphere. The interior of the vacuum container 11 is kept in a vacuum atmosphere during a film forming process. The vacuum container 11 is formed in a substantially circular shape. The vacuum container 11 includes a top plate 12 and a container body 13, which defines a sidewall and a bottom portion of the vacuum container 11. The top plate 12 is detachably attached to the container body 13. FIG. 1 shows a state in which the top plate 12 is attached to the container body 13. FIGS. 2 and 3 show a state in which the top plate 12 is removed from the container body 13.

In a central area of the vacuum container 11, a substantially circular convex portion 14 having an enlarged diameter at the lower end side thereof is installed so as to protrude downward from the top plate 12. The convex portion 14 defines a central region C having a gas flow path 15 in cooperation with a support portion 21, which supports the rotary table 2 in the central area of the vacuum container 11. Reference numeral 10 in FIG. 1 designates a supply pipe which supplies a nitrogen gas ($N_2$ gas) as a separating gas to the gas flow path 15. The nitrogen gas is supplied from the gas flow path 15 onto the surface of the rotary table 2 so as to flow toward an outer periphery of the rotary table 2. Thus, the raw material gas and the reaction gas to be described later are prevented from being mixed with other gasses in the central region C, whereby the supply region of the raw material gas and the supply region of the reaction gas are separated from each other. An inwardly-extending cutout 16 is installed on the upper surface of the enlarged diameter portion of the convex portion 14. The cutout 16 makes up a support portion of a nozzle cover 5 to be described later.

The rotary table 2 is formed in a circular shape so as to extend outward from the support portion 21. The rotary table 2 rotates in a clockwise direction around a center axis thereof by a rotary drive mechanism 22 installed below the support portion 21. On a surface side (one surface side) of the rotary table 2, five concave portions 23 as substrate loading regions are formed along the rotation direction of the rotary table 2. The Wafers W are loaded on the concave portions 23. By the rotation of the rotary table 2, the wafers W loaded on the concave portions 23 are revolved around the center axis of the rotary table 2.

A wafer transfer gate 17 is formed at the sidewall of the vacuum container 11. The wafer transfer gate 17 can be freely opened and closed by a gate valve 18. A transfer mechanism 24 (see FIGS. 2 and 3), which carries the wafers W into and out of the vacuum container 11, can move toward and away from the interior of the vacuum container 11. The entry region of the transfer mechanism 24 within the vacuum container 11 is indicated as a wafer transfer region S1. While not shown in the drawings, elevating pins are installed below the rotary table 2 in the wafer transfer region S1. The elevating pins protrude from and retract into the surface of the rotary table 2 through holes 25 (see FIG. 3) formed in each of the concave portions 23. Thus, the wafers W are transferred between each of the concave portions 23 and the transfer mechanism 24.

As shown in FIG. 1, a heater 27 is installed below the rotary table 2 at a position spaced apart from the rotary table 2. The rotary table 2 is heated by radiation heat applied to the rotary table 2 from the heater 27. Thus, the wafers W loaded on the rotary table 2 are heated. Reference numeral 28 in FIG. 1 designates a purge gas supply pipe for purging an arrangement space of the heater 27 with a nitrogen gas. A purge gas supply part 29, which supplies the nitrogen gas as a purge gas from the lower central portion of the rotary table 2 toward the peripheral edge portion thereof, is installed at a case body 20 which covers the bottom center of the vacuum container 11.

As shown in FIG. 3, at positions facing the respective passage regions of the concave portions 23 of the rotary table 2, four nozzles 31, 32, 41 and 42 are radially disposed to be spaced apart from each other at intervals in the circumferential direction of the vacuum container 11. The nozzles 31, 32, 41 and 42 are fixedly installed at an outer peripheral wall of the vacuum container 11 so as to, for example, horizontally extend from the outer peripheral wall of the vacuum container 11 toward the central region C. In this example, a raw material gas nozzle 31, a first separating gas nozzle 41, a reaction gas nozzle 32 and a second separating gas nozzle 42 are disposed clockwise in this order.

The respective nozzles 31, 32, 41 and 42 are respectively connected to gas supply sources to be described below. That is to say, as shown in FIG. 3, the raw material gas nozzle 31 is connected to a supply source 311 of a silicon (Si)- containing raw material gas, e.g., a 3DMAS (tris(dimethylamino)silane: $SiH(N(CH_3)_2)_3$) gas, through a flow rate regulating valve 312 and is connected to a supply source 313 of the nitrogen gas as the carrier gas through a flow rate regulating valve 314. The reaction gas nozzle 32 is connected to a supply source 321 of the reaction gas, e.g., a mixed gas of an ozone ($O_3$) gas and an oxygen ($O_2$) gas (specifically, oxygen gas supply source having an ozonizer) through a flow rate regulating valve 322. The first separating gas nozzle 41 and the second separating gas nozzle 42 are connected to the supply source 313 of the nitrogen gas as a separating gas through flow rate regulating valves 411 and 421 respectively.

Figure 4:
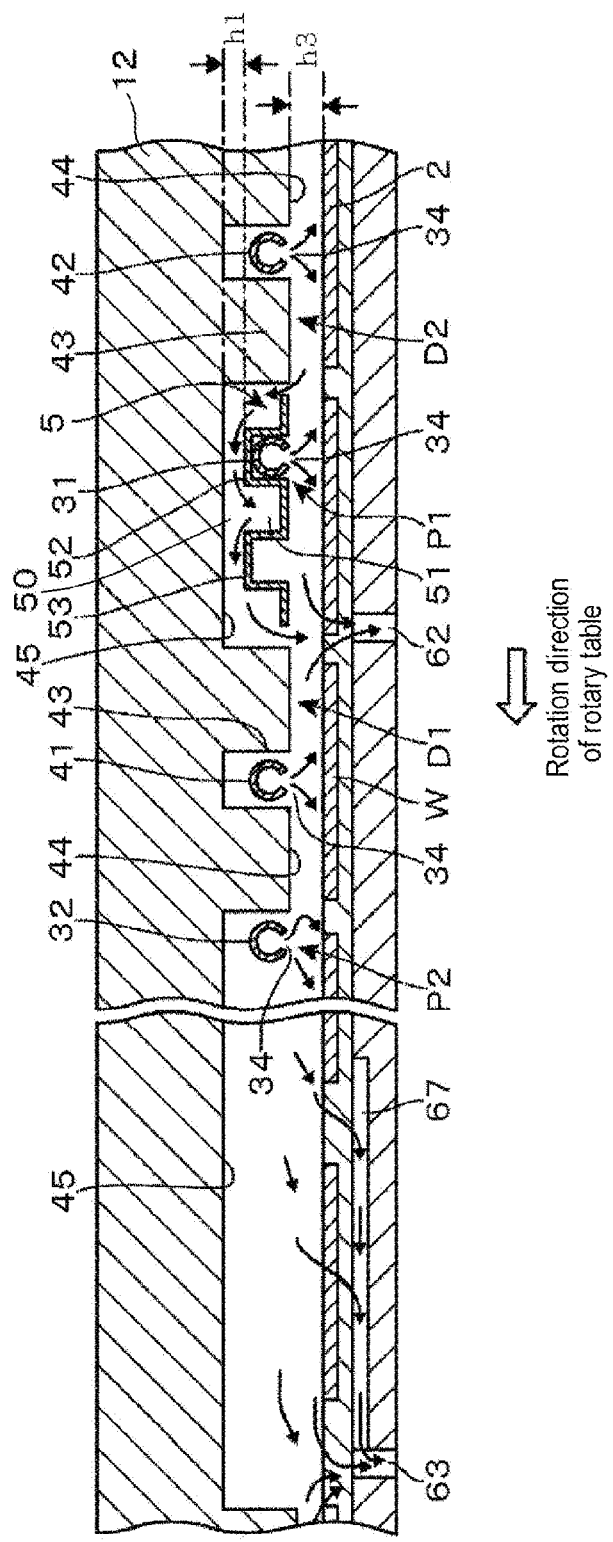
FIG. 4 is a vertical sectional side view of the film forming apparatus taken along a circumferential direction.

FIG. 4 is a vertical sectional side view taken along the rotation direction of the rotary table 2. At the lower surface of each of the gas nozzles 31, 32, 41 and 42, a plurality of gas discharge holes 34 is formed along the longitudinal direction of each of the gas nozzles 31, 32, 41 and 42. The gas stored in each of the supply sources is discharged from the gas discharge holes 34. In this way, the mixed gas of the raw material gas and the carrier gas is discharged from the gas discharge holes 34 of the raw material gas nozzle 31. In this example, in order to prevent the concentration of the raw material gas from being lowered by the separating gas discharged from the central region C at the center side of the rotary table 2, the gas discharge holes 34 of the raw material gas nozzle 31 are formed in a larger number at the center side than at the periphery side. With this configuration, the large amount of the raw material gas can be supplied at the center side.

A lower region of the raw material gas nozzle 31 and a lower region of the nozzle cover 5 installed at the raw material gas nozzle 31 constitute a first processing region P1 where the raw material gas is supplied and adsorbed onto the wafers W. The nozzle cover 5 will be described later in detail. A lower region of the reaction gas nozzle 32 constitutes a second processing region P2 where the reaction gas is supplied and is reacted with the raw material adsorbed onto the wafers W.

Two fan-shaped protrusion portions 43 are disposed at a lower side of the top plate 12 of the vacuum container 11 so as to protrude downward from the top plate 12. The protrusion portions 43 are installed to be spaced apart from each other at intervals in the circumferential direction. At the rotation center side of the rotary table 2, the respective protrusion portions 43 are connected to the convex portion 14 which defines the central region C. The separating gas nozzles 41 and 42 are accommodated in the respective protrusion portions 43 and are installed so as to divide the protrusion portions 43 in the circumferential direction. That is to say, as shown in FIG. 4, a low first ceiling surface 44 as the lower surface of each of the protrusion portions 43 is disposed at both sides of each of the separating gas nozzles 41 and 42 in the circumferential direction of the rotary table 2. Second ceiling surfaces 45 higher than the first ceiling surface 44 are disposed at both sides of the first ceiling surface 44 in the circumferential direction of the rotary table 2.

Separating regions for preventing the raw material gas and the reaction gas from being mixed with each other are constituted below the first ceiling surface 44. The separating regions where the separating gas nozzles 41 and 42 are installed will be respectively referred to as a first separating region D1 and a second separating region D2. During a film forming process, the separating gas supplied from the first and second separating gas nozzles 41 and 42 to the first and second separating regions D1 and D2 spreads through the separating regions D1 and D2 in the circumferential direction and causes the raw material gas and the reaction gas to flow toward vacuum exhaust ports 62 and 63 to be described later. In FIG. 4, the gas flows during the film forming process are illustrated by arrows.

Other parts of the vacuum container 11 will be described. As shown in FIGS. 1 and 3, a ring member 61 is disposed below the outer side of the rotary table 2 so as to extend along the circumference of the vacuum container 11. A first vacuum exhaust port 62 and a second vacuum exhaust port 63 are formed at the ring member 61. The first vacuum exhaust port 62 and the second vacuum exhaust port 63 are separated in the circumferential direction. The first vacuum exhaust port 62 exhausts the raw material gas, and the second vacuum exhaust port 63 exhausts the reaction gas and the separating gas. For that reason, the first vacuum exhaust port 62 is formed at a position adjacent to the first separating region D1 in the first processing region P1. The second vacuum exhaust port 63 is formed at a position adjacent to the second separating region D2 in the second processing region P2.

As can be noted from the first vacuum exhaust port 62 representatively illustrated in FIG. 1, each of the first and second vacuum exhaust ports 62 and 63 is connected to a vacuum pump 65 as a vacuum exhaust mechanism via an exhaust pipe 64. A pressure regulating part 66 such as a butterfly valve or the like is connected to the exhaust pipe 64. Thus, the amount of the gas exhausted from each of the vacuum exhaust ports 62 and 63 is independently controlled. Reference numeral 67 in FIG. 3 designates a groove formed at the ring member 61. The groove 67 is formed to extend from the second vacuum exhaust port 63 toward the upstream side of the rotation direction along the circumferential direction. The groove 67 serves to guide the reaction gas supplied from the reaction gas nozzle 32 and the separating gas supplied from the first separating gas nozzle 41 to the second vacuum exhaust port 63.

Figure 5:
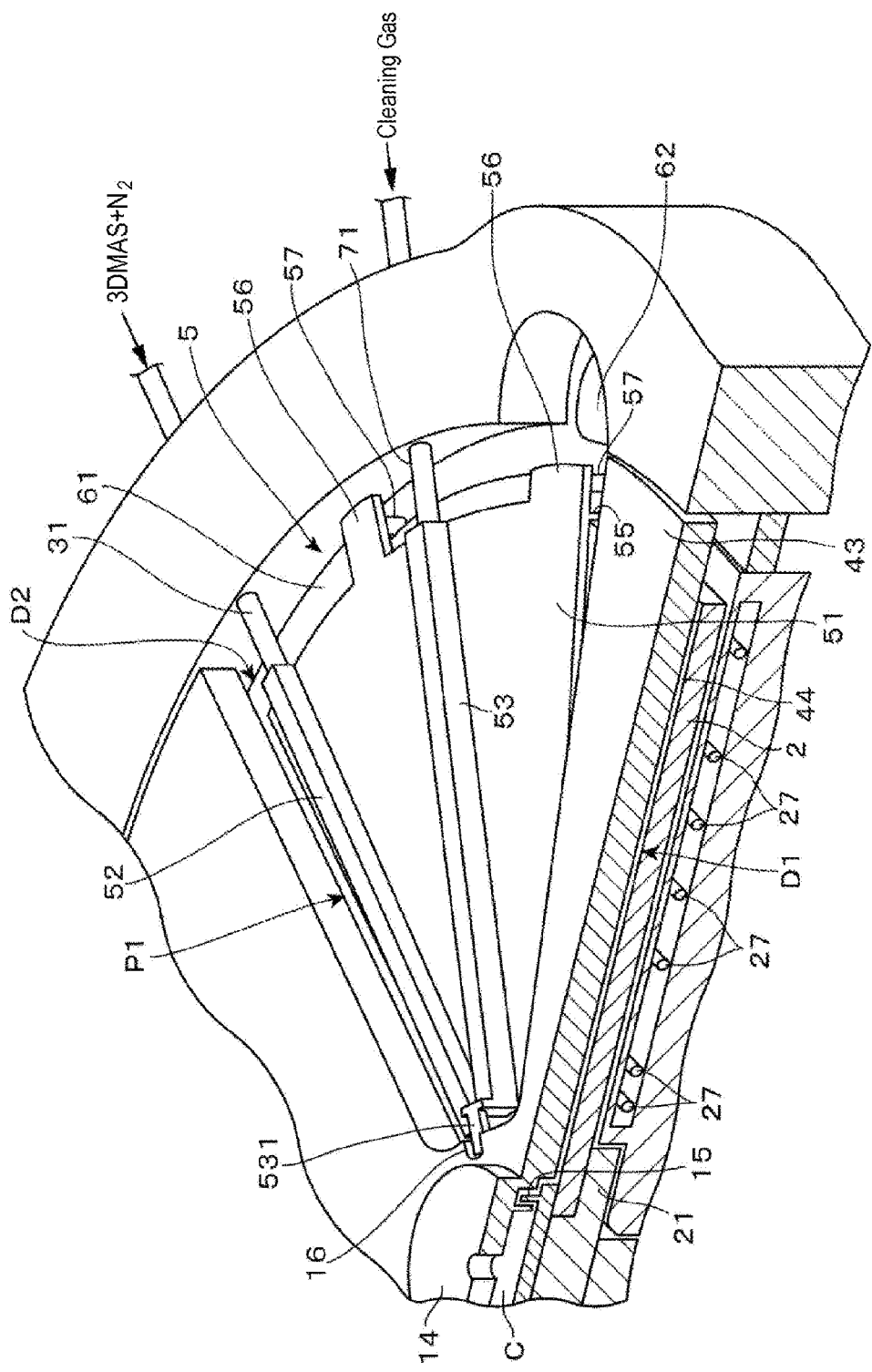
FIG. 5 is a top perspective view of a nozzle cover installed in the film forming apparatus.
Figure 6:
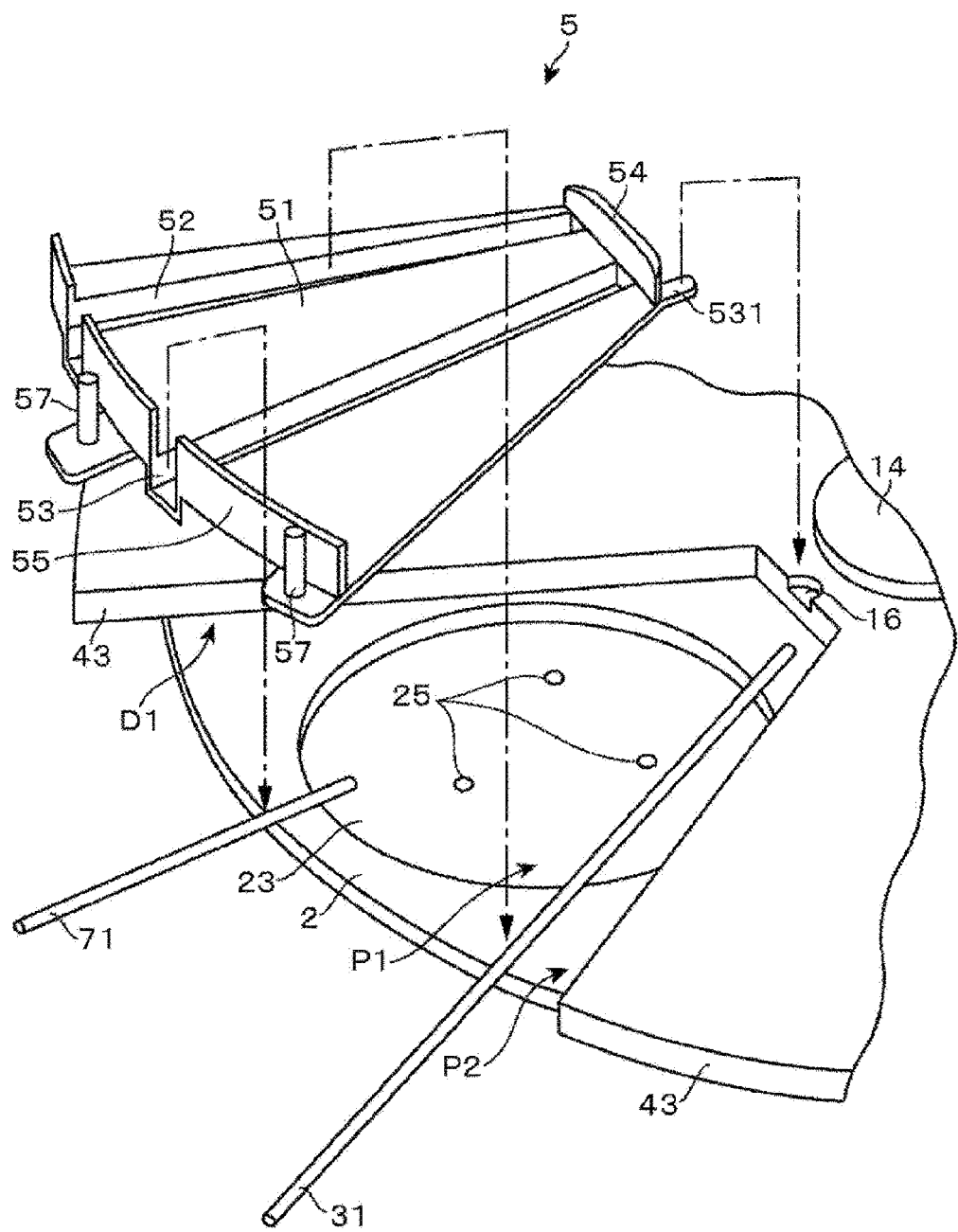
FIG. 6 is a perspective view of the nozzle cover viewed from a back surface side of the nozzle cover.
Figure 7:
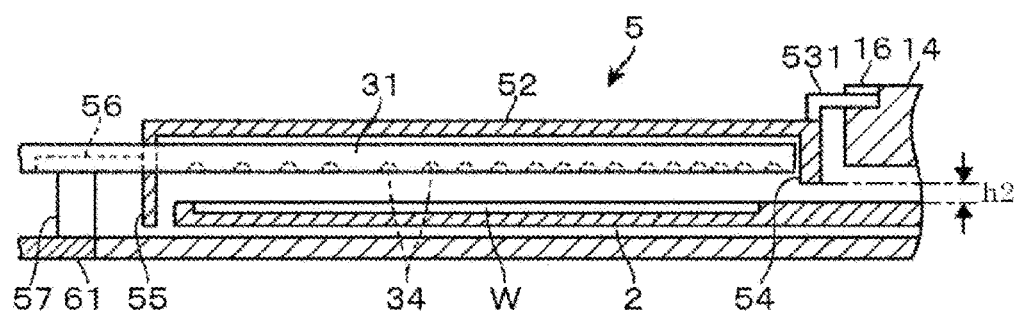
FIG. 7 is a vertical sectional side view of the nozzle cover.
Figure 8:
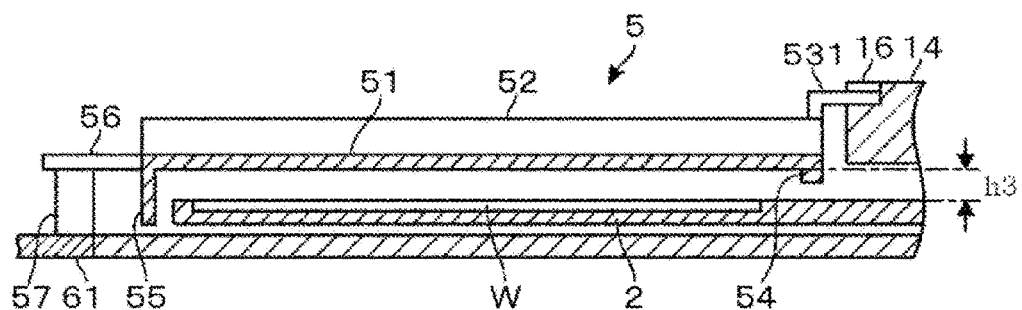
FIG. 8 is a vertical sectional side view of the nozzle cover.
Figure 9:
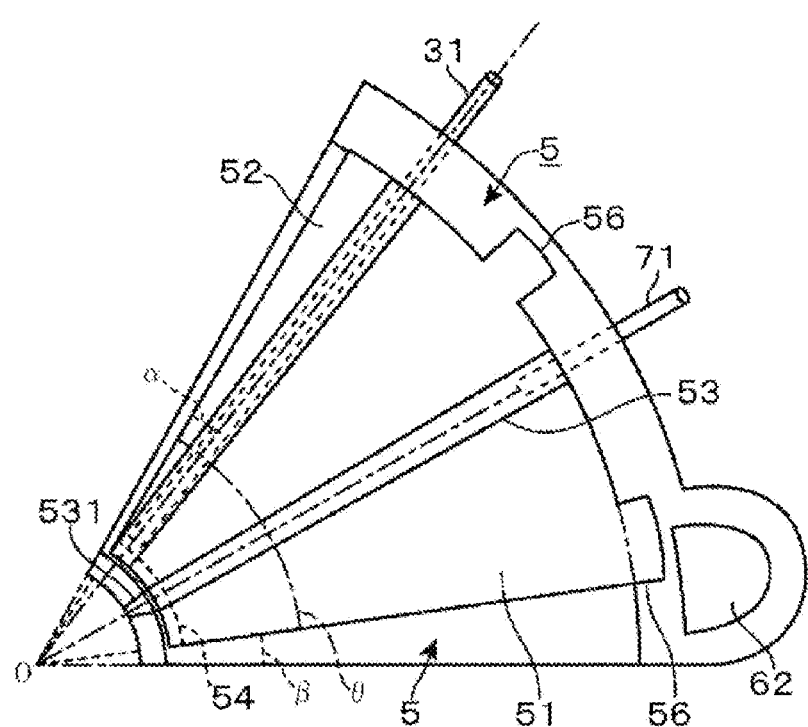
FIG. 9 is a schematic plane view of the nozzle cover.

Subsequently, a description will be made on the nozzle cover 5. FIG. 5 shows an upper surface of the nozzle cover 5 mounted to the raw material gas nozzle 31. FIG. 6 shows a lower surface of the nozzle cover 5 removed from the raw material gas nozzle 31. FIGS. 7 and 8 are vertical sectional side views of the nozzle cover 5. FIG. 9 is a schematic plane view of the nozzle cover 5. The nozzle cover 5 includes a flat flow regulating plate portion 51 and base portions 52 and 53, which are installed so as to protrude upward from the flow regulating plate portion 51 in, e.g., a square shape. The base portion 52 extends along the longitudinal direction of the raw material gas nozzle 31 and has a substantially U-like cross-sectional shape. Thus, the upper side and the lateral sides of the raw material gas nozzle 31 are covered with the base portion 52. As will be described later, a cleaning gas nozzle 71 is shorter in length than the raw material gas nozzle 31. However, the upper side and the lateral sides of the cleaning gas nozzle 71 are covered with the base portion 53.

The flow regulating plate portion 51 protrudes so as to extend from the lower left and right ends of the base portions 52 and 53 in the horizontal direction, namely from the upstream and downstream sides of the rotation direction of the rotary table 2 along the longitudinal direction of the gas nozzles. The flow regulating plate portion 51 is formed at a region between the protrusion portion 43 forming the first separating region D1 and the protrusion portion 43 forming the second separating region D2 in a substantially fan-like plane-view shape such that, for example, the flow regulating plate portion 51 is continuously widened from the center side of the rotary table 2 toward the peripheral side thereof in conformity with the shape of the region. As shown in FIGS. 2, 3 and 5, the nozzle cover 5 is installed such that a front end portion (small width portion) thereof having a fan-like plane-view shape is adjacent to the convex portion 14 and such that a rear end portion (large width portion) thereof is positioned more outward than the peripheral edge of the rotary table 2. The front end portion and the rear end portion of the flow regulating plate portion 51 constitute, e.g., some portions of circles which have a center coinciding with the rotation center O of the rotary table 2 and which differ in radius from each other. As shown in FIG. 3, the rear end portion of the flow regulating plate portion 51 is formed to extend from a position near the center of the first vacuum exhaust port 62 to a position near the protrusion portion 43 which forms the second separating region D2.

The base portion 52, which covers the raw material gas nozzle 31, is installed at a position adjacent to the second separating region D2. The base portion 53, which covers the cleaning gas nozzle 71, is installed, for example, at a position shifted toward the first separating region D1 from the circumferential center of the nozzle cover 5. For example, a projection portion 531 projecting toward the center of the rotary table 2 is installed at the base portion 53. The projection portion 531 is accommodated within the cutout 16 of the convex portion 14. The projection portion 531 serves to support the nozzle cover 5 on the rotary table 2.

A protuberance portion 54, which protrudes toward the rotary table 2 at a position shifted toward the center of the rotary table 2 from the gas discharge holes 34 of the raw material gas nozzle 31, is formed at the front end of the lower surface of the flow regulating plate portion 51 so as to extend in the circumferential direction. The protuberance portion 54 is installed such that the lower end thereof is positioned more downward than the gas discharge holes 34 of the raw material gas nozzle 31. A portion of the flow regulating plate portion 51 existing at the outer periphery side of the rotary table 2 is bent downward to form a facing portion 55 which faces the outer periphery of the rotary table 2. A plurality of, e.g., two, portions of the outer circumferential surface of the facing portion 55 of the flow regulating plate portion 51 further extends outward from the rotary table 2, thereby forming extension portions 56. Support pillars 57 are installed at lower surfaces of the extension portions 56. The support pillars 57 are fixed to the ring member 61 by, e.g., screws.

As shown in FIG. 4, a circulating space 50, which allows a gas to circulate between the rotation-direction upstream and downstream sides of the nozzle cover 5, is formed between the base portions 52 and 53 and the top plate 12. A height h1 of the circulating space 50 is, e.g., from 5 to 15 mm. Furthermore, as shown in FIG. 7, a separation distance h2 between the lower surface of the protuberance portion 54 and the surface of the rotary table 2 (surfaces of wafers W) is, e.g., from 1.0 mm to 2.0 mm, specifically 1.5 mm. As shown in FIGS. 4 and 8, at the outer most periphery side of the rotary table 2 than the protuberance portion 54, the lower surface of the flow regulating plate portion 51 is formed at, e.g., the same height as the lower ends of the gas discharge holes 34 of the raw material gas nozzle 31. A separation distance h3 between the flow regulating plate portion 51 and the surface of the rotary table 2 is, e.g., from 2.0 mm to 4.0 mm, specifically 3.0 mm.

The role of the nozzle cover 5 will be described. During the film forming process, the gases are supplied from the respective gas nozzles 31, 32, 41 and 42 while the rotary table 2 is rotated. At this time, the mixed gas of the raw material gas and the carrier gas discharged from the raw material gas nozzle 31 flows through between the flow regulating plate portion 51 and the rotary table 2 along the wafers W. That is to say, the flow regulating plate portion 51 serves to suppress diffusion of the raw material gas around the raw material gas nozzle 31 and to increase the reactivity of the wafers W with the raw material gas. Furthermore, the flow regulating plate portion 51 serves to guide the separating gas, which flows from the second separating gas nozzle 42 toward the first processing region P1, to the circulating space 50 and to prevent the separating gas from entering the first processing region P1. Thus, it is possible to suppress reduction of the concentration of the raw material gas in the first processing region P1.

As described above, the separating gas is discharged from the central region C in the circumferential direction. However, the protuberance portion 54 formed at the front end portion of the flow regulating plate portion 51 restrains the separating gas, which is discharged from the central region C, from flowing between the flow regulating plate portion 51 and the rotary table 2. As set forth earlier, in the related art, the discharge amount of the raw material gas is changed in the longitudinal direction of the gas nozzle depending on the flow rate of the carrier gas. For example, if the flow rate of the carrier gas is increased, the gas flow velocity becomes higher. Thus, a large amount of the raw material gas is discharged at the front end side of the gas nozzle 31. However, the protuberance portion 54 is installed to retain inflow of the separating gas from the central region. This suppresses the action that the separating gas extrudes the raw material gas toward the outer periphery of the rotary table 2. Therefore, even if the flow rate of the carrier gas is not increased, the raw material gas discharged from the raw material gas nozzle 31 spreads toward the rotary table center side of the flow regulating plate portion 51. Thus, the concentration of the raw material gas within the planes of the wafers W is made uniform regardless of the flow rate of the carrier gas, whereby the adsorption reaction of the raw material gas occurs while keeping the in-plane uniformity high.

Next, one example of other dimensions of the nozzle cover 5 will be described with reference to the plane view shown in FIG. 9. The angle α between a contour line of a rotation-direction upstream side of the flow regulating plate portion 51 and the extension direction of the raw material gas nozzle 31 is, e.g., 15 degrees. Furthermore, the angle θ between the contour line of the rotation-direction upstream side of the flow regulating plate portion 51 and a contour line of the rotation-direction downstream side of the flow regulating plate portion 51 is, e.g., 50 degrees. The flow regulating plate portion 51 is formed in a fan shape as shown in FIG. 9. This makes it possible to suppress diffusion of the raw material gas at the peripheral edge side of the rotary table 2 where the velocity is high, thereby assuring the adsorption of the raw material gas onto the wafers W.

In order to make sure that the flow of the raw material gas moving from the raw material gas nozzle 31 toward the first vacuum exhaust port 62 is not obstructed by the flow regulating plate portion 51, the angle β between the contour line of the rotation-direction downstream side of the flow regulating plate portion 51 and a line (indicated by a chain line in FIG. 9) interconnecting the center O of the rotary table 2 and an end portion of a rotation-direction downstream side of the first vacuum exhaust port 62 is set to become equal to or larger than 0 degrees. The nitrogen gas riding on the nozzle cover 5 in the aforementioned manner passes over the nozzle cover 5 and flows into the first vacuum exhaust port 62 without making contact with the rotary table 2. Then, the nitrogen gas is exhausted.

The cleaning gas nozzle 71 is configured to discharge a cleaning gas, e.g., a fluorine-based gas such as $ClF_3$ (chlorine trifluoride) or the like, toward the rotary table 2 from the front end thereof. The cleaning gas nozzle 71 is connected to a supply source 711 of the cleaning gas through a flow rate regulating valve 712. The fluorine-based gas is a gas mainly including fluorine or a fluorine compound. The cleaning gas nozzle 71 is shorter in length than, e.g., the raw material gas nozzle 31. A front end of the cleaning gas nozzle 71 is positioned at, e.g., a position spaced apart inward by 2 cm to 3 cm from a rear end of the base portion 53. The discharged cleaning gas is supplied toward the center of the rotary table 2 from the peripheral edge portion thereof, thereby removing a silicon oxide film formed on the rotary table 2.

A control unit 7 configured as a computer for controlling overall operations of the film forming apparatus 1 is installed in the film forming apparatus 1. A program for executing a film forming process in the below-mentioned manner is stored in the control unit 7. The program transmits control signals to the respective parts of the film forming apparatus 1 to control the operations of the respective parts. Specifically, the program controls the respective operations such as an operation of a gas supply and a gas shutout from the respective gas sources to the respective gas nozzles, an operation of controlling a rotation speed of the rotary table 2 rotated by the rotary drive mechanism 22, an operation of regulating the exhaust amount of the gases exhausted from the respective vacuum exhaust ports 62 and 63 by the pressure regulating part 66, and the like. The program includes a group of steps to execute respective processes to be described later by controlling the aforementioned operations. The program is installed in the control unit 7 from a storage medium such as a hard disk, a compact disk, a magneto-optical disk, a memory card, a flexible disk and the like.

Next, a sequence of the film forming process implemented by the film forming apparatus 1 will be described. First, while intermittently rotating the rotary table 2 with the gate valve 18 opened, the wafers W having a diameter of, e.g., 300 mm are sequentially transferred to the wafer transfer region S1 by the transfer mechanism 24 and are loaded on the five concave portions 23 of the rotary table 2. Then, the gate valve 18 is closed and the exhaust is performed from the first and second vacuum exhaust ports 62 and 63 by the vacuum pump 65, whereby the interior of the vacuum container 11 is completely evacuated. In parallel with the exhaust, the rotary table 2 kept in a stopped state is rotated and the temperature of all of the wafers W is increased to become equal to the temperature of the rotary table 2, e.g., 720 degrees C. Then, the mixed gas of the 3DMAS gas as the raw material gas and the nitrogen gas as the carrier gas, and an $O_3$ gas and an $O_2$ gas as the reaction gas, are discharged from the raw material gas nozzle 31 and the reaction gas nozzle 32, respectively. Furthermore, the nitrogen gas as the separating gas is discharged from the separating gas nozzles 41 and 42 and the central region C while the nitrogen gas as the purge gas is discharged from the purge gas supply pipe 28 and the purge gas supply part 29. The exhaust amounts from the first and second vacuum exhaust ports 62 and 63 are controlled by the respective pressure regulating parts 66. The internal pressure of the vacuum container 11 is regulated to a predetermined processing pressure. Then, the film forming process is started.

The wafers W alternately pass through the first processing region P1 below the raw material gas nozzle 31 and the second processing region P2 below the reaction gas nozzle 32. The 3DMAS gas is adsorbed onto the wafers W. Then, the $O_3$ gas is adsorbed onto the wafers W to thereby oxidize 3DMAS molecules, whereby one or more silicon oxide molecule layers are formed on each of the wafers W. The silicon oxide molecule layers are sequentially laminated in this way to form a silicon oxide film having a specified film thickness. During the formation of the silicon oxide film, an annealing process is performed by heating the silicon oxide film to 600 degrees C. or more. Thus, the distortion of molecular arrangement of the silicon oxide is eliminated.

Figure 10:
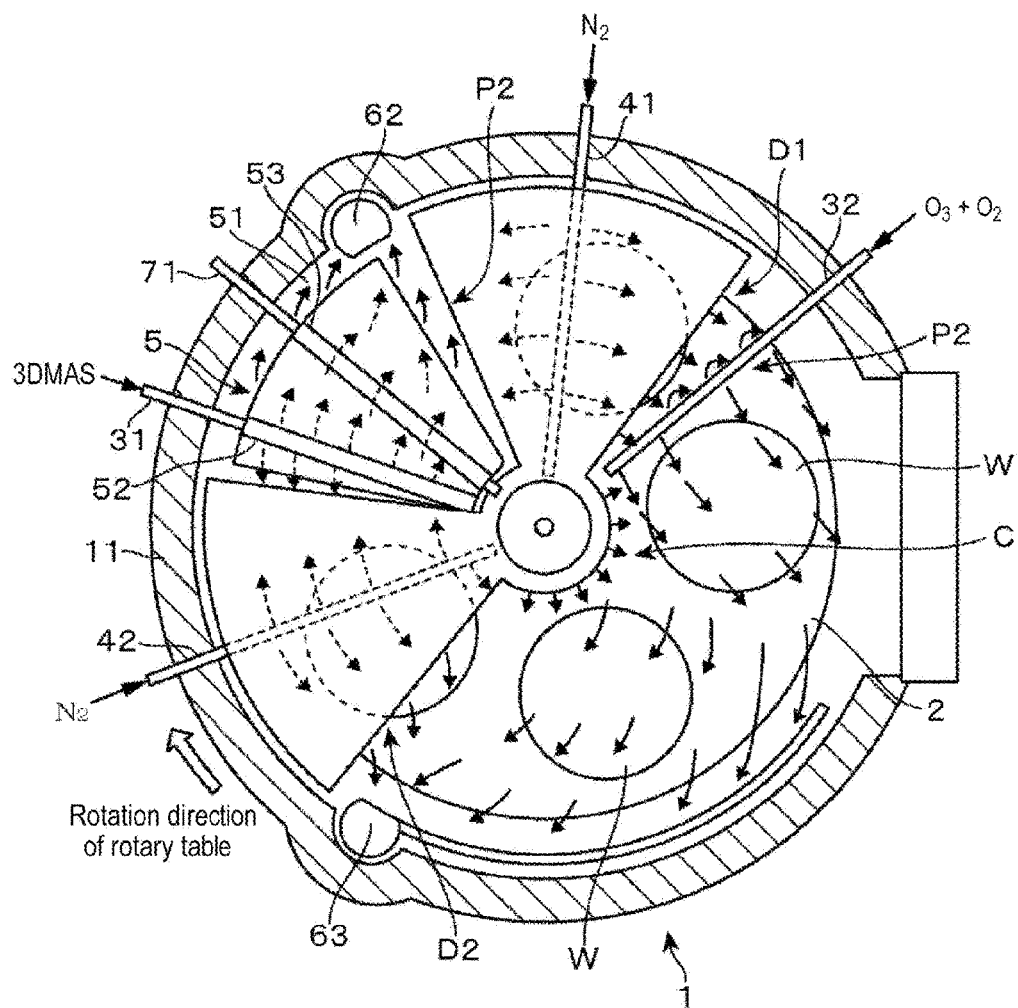
FIG. 10 is an explanatory view showing gas streams during a film formation in the film forming apparatus.

FIG. 10 is a horizontal sectional view of the vacuum container 11. Like FIG. 4, the gas flows in the respective portions during the film forming process are indicated by arrows. As shown in FIGS. 4 and 10, the separating gas is supplied to the first and second separating regions D1 and D2 existing between the first processing region P1 and the second processing region P2. Thus, the respective gases are exhausted such that the raw material gas and the reaction gas are prevented from being mixed with each other. Furthermore, the separating gas supplied to the central region C is supplied to the radial outer side of the rotary table 2, thereby preventing mixture of the 3DMAS gas and the $O_3$ gas in the central region C. Since the purge gas is supplied to a lower side of the rotary table 2, the gas to be diffused to the lower side of the rotary table 2 is returned to the first and second vacuum exhaust ports 62 and 63 by the purge gas.

At this time, as mentioned above, the separating gas supplied from the second separating gas nozzle 42 flows toward the first processing region P1. The separating gas flows so as to ride on the nozzle cover 5 and is exhausted from the first vacuum exhaust port 62. Furthermore, the raw material gas excessively supplied to the first processing region P1 and the separating gas infiltrated into the first processing region P1 are also exhausted from the first vacuum exhaust port 62. The separating gas supplied from the central region C tends to flow in the circumferential direction. Since the protuberance portion 54 is formed at the first processing region P1 near the central region C, the separating gas flows outward along the protuberance portion 54. Thus, the separating gas supplied from the central region C is restrained from flowing between the flow regulating plate portion 51 and the rotary table 2. In the meantime, within the nozzle cover 5, the raw material gas and the carrier gas are discharged from the raw material gas nozzle 31 in the radial direction of the rotary table 2. Since the inflow of the separating gas from the front end side of the nozzle cover 5 is suppressed, the raw material gas spreads to the front end side of the nozzle cover 5 regardless of the flow rate of the carrier gas as described above. Thus the film forming process is performed with good in-plane uniformity as set forth above.

If the rotary table 2 is rotated a predetermined number of times and the silicon oxide film having a desired film thickness is formed, the flow rates of the respective gases supplied from the respective gas nozzles 31, 32, 41 and 42 and the flow rate of the separating gas supplied to the central region C are reduced. The rotation of the rotary table 2 is stopped and the gate valve 18 is opened. By the intermittent rotation of the rotary table 2 and an elevating operation of the elevating pins, the wafers W are sequentially transferred to the transfer mechanism 24 and are carried out from the vacuum container 11. After all of the wafers W are carried out, the gate valve 18 is closed.

Thereafter, the rotary table 2 is continuously rotated again and the cleaning gas is supplied from the cleaning gas nozzle 71 onto the rotary table 2, thereby starting a cleaning process. The cleaning gas decomposes the silicon oxide formed on the rotary table 2. The cleaning gas and the decomposed material are absorbed to the exhaust ports. Since the cleaning gas nozzle 71 is covered with the nozzle cover 5, the cleaning gas is filled within the nozzle cover 5. Thus, the cleaning gas makes contact with the silicon oxide in the cleaning gas supply region, whereby the silicon oxide is reliably removed. If the rotary table 2 is rotated a predetermined number of times, the supply of the cleaning gas is stopped and the rotation of the rotary table 2 is stopped. Thus, the cleaning process is terminated. Thereafter, the wafers W are transferred into the vacuum container 11 again and the film forming process described above is implemented.

According to the aforementioned embodiment, the film forming apparatus 1 includes the flow regulating plate portion 51 which extends along the longitudinal direction of the raw material gas nozzle 31 from the upstream and downstream sides of the rotation direction of the rotary table 2 in the raw material gas nozzle 31. The protuberance portion 54, which protrudes toward the rotary table 2, is formed at the flow regulating plate portion 51. The protuberance portion 54 is formed at the center side of the rotary table 2 rather than the gas discharge holes 34 of the raw material gas nozzle 31, thereby restraining the separating gas supplied from the central region C from flowing between the flow regulating plate portion 51 and the rotary table 2. Therefore, regardless of the flow rate of the carrier gas, the raw material gas can reach to the front end of the flow regulating plate portion 51. This suppresses the variations of the raw material gas concentration between the center side and the outer periphery side of the rotary table 2. Thus, it is possible to obtain good in-plane uniformity over a wide range of a carrier gas flow rate. Since the in-plane uniformity of the film thickness is not changed by the flow rate of the carrier gas, it becomes easy to regulate the in-plane uniformity of the film thickness, for example, during the startup and maintenance of the apparatus.

By the term "good in-plane uniformity", it is meant that, when the flow rate of the carrier gas is set to fall within a range of from 500 cc/min to 1,000 cc/min in the film forming process for the wafers having a diameter of 300 mm, the in-plane uniformity is ±2.0% or less, or 1.5% or less. In the following description, the flow rate unit "cc/min" will be referred to as "sccm". The value of the flow rate is the value indicated by a flow meter during the processes. In this regard, the in-plane uniformity is calculated by the following formula (1) after the film thickness is measured at 49 measurement points in a region spaced apart inward by 1.8 mm from an outer edge of a wafer with an ellipsometer. The 49 measurement points refer to a plurality of points existing on a plurality of concentric circles which are drawn about the center of the wafer W such that the radii of the concentric circles are sequentially increased by 50 mm.

$$\{(\text{maximum film thickness} - \text{minimum film thickness})/(\text{average film thickness} \times 2)\} \times 100 \quad (1)$$

Figure 16:
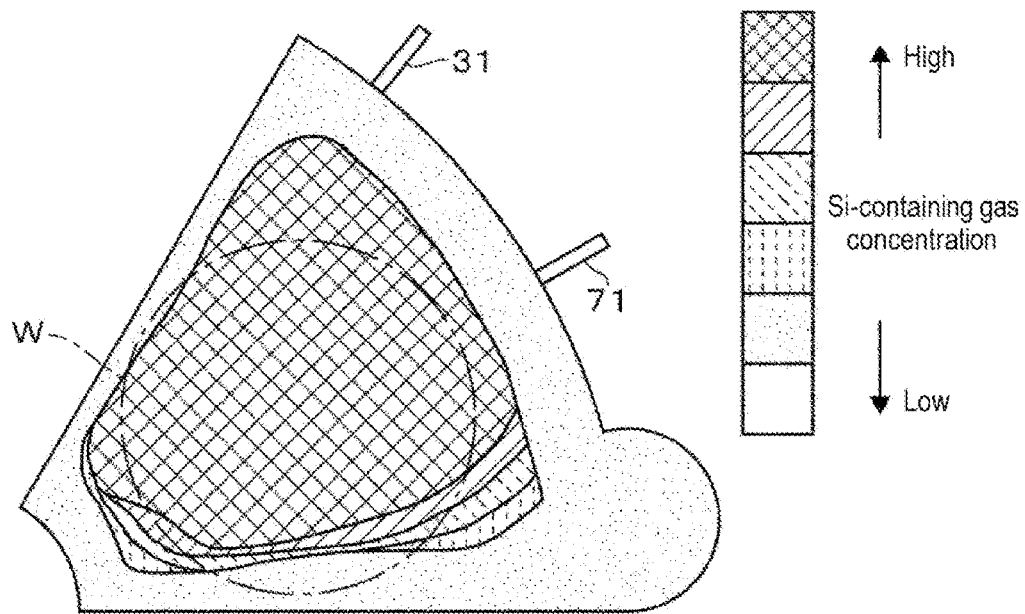
FIG. 16 is a schematic diagram showing a result of an evaluation test.

In the example to be described later, the silicon oxide film is formed by actually using the nozzle cover 5, and the in-plane uniformity of the film thickness available at that time is measured. The results are shown in FIG. 16. It can be confirmed that, when the flow rate of the carrier gas is set to fall within a range of from 500 sccm to 1,000 sccm, the in-plane uniformity becomes ±2.0% or less.

In the example, even in a case where a nozzle cover identical in configuration with the aforementioned nozzle cover is used except for the absence of the protuberance portion 54, a film forming process is implemented in a similar manner and the in-plane uniformity of the film thickness is measured. In this case, when the flow rate of the carrier gas is set to fall within a range of from 300 sccm to 1,000 sccm, the in-plane uniformity of the film thickness is greatly changed depending on the flow rate of the carrier gas. As the flow rate of the carrier gas becomes larger, the in-plane uniformity becomes higher. Presumably, the reason is as follows. If the protuberance portion 54 is absent, the separating gas supplied from the central region C flows between the flow regulating plate portion 51 and the rotary table 2. In the meantime, if the flow rate of the carrier gas is changed as mentioned above, the discharge position of the raw material gas is changed in the longitudinal direction of the raw material gas nozzle 31. Accordingly, if the flow rate of the carrier gas is increased, the raw material gas spreads even to the front end side of the raw material gas nozzle 31, thereby improving the in-plane uniformity. However, if the flow rate of the carrier gas is reduced, the amount of the raw material gas discharged from the front end side of the raw material gas nozzle 31 becomes small and the separating gas from the central region C flows toward the front end side of the raw material gas nozzle 31. Thus, the film thickness at the front end side of the raw material gas nozzle 31 becomes small and the in-plane uniformity is reduced. As mentioned above, when the flow rate of the carrier gas is changed, the change amount of the in-plane uniformity largely varies depending on the existence or absence of the protuberance portion 54. It is therefore understood that, for the purpose of improving the in-plane uniformity over a wide range of carrier gas flow rate, it is very effective to suppress the in-flow of the separating gas supplied from the central region C by the protuberance portion 54.

Furthermore, the flow regulating plate portion 51 is formed in a large size so as to widely cover the processing region existing between the first separating region D1 and the second separating region D2. Therefore, as is apparent from the below-mentioned example, it is possible to increase the film forming rate. Since the plane-view size of the flow regulating plate portion 51 is large, it is possible to confine the raw material gas between the flow regulating plate portion 51 and the rotary table 2. It is easy for Si to become saturated with respect to the wafers W. Moreover, an adsorption time of the raw material gas to the wafers W can be prolonged by enlarging the flow regulating plate portion 51. This can increase the film forming rate.

Figure 15:
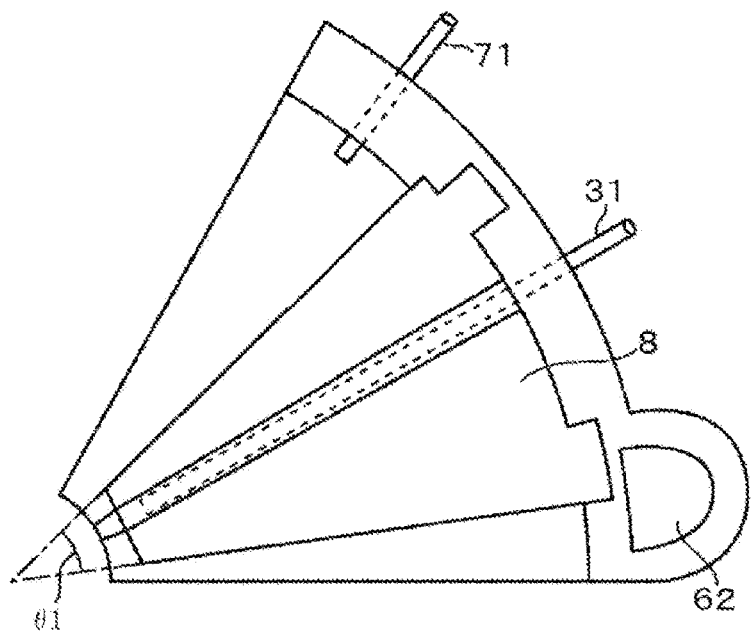
FIG. 15 is a schematic plane view showing a comparative example of the nozzle cover.

FIG. 15 shows, as a comparative example, a flow regulating plate portion 8 having the same size as that of the related art. The angle θ1 between a contour line of a rotation-direction-upstream side of the flow regulating plate portion 8 and a contour line of a rotation-direction-downstream side of the flow regulating plate portion 8 is, e.g., 38 degrees. The flow regulating plate portion 8 is smaller in plane-view size than the flow regulating plate portion 51 of the present disclosure. Therefore, the raw material gas easily flows out from the flow regulating plate portion 8. Moreover, the separating gas easily flows in from the separating regions D1 and D2 or the central region C. For that reason, the raw material gas is diluted with the separating gas and the amount of the raw material gas adsorbed onto the wafers W is reduced. Thus, the film forming rate is reduced. Since the separating gas flows in from the central region C, the regulation of the in-plane uniformity needs to be performed by balancing the inflow amount of the separating gas supplied from the central region C and the regulating amount of the raw material gas in the longitudinal direction of the raw material gas nozzle 31 pursuant to the flow rate regulation of the carrier gas. However, as mentioned above, the raw material gas easily flows out from the flow regulating plate portion 8 and the separating gas easily flows in from the separating regions D1 and D2 or the central region C. Therefore, as described in the below-mentioned example, the in-plane uniformity varies even if the flow rate of the carrier gas is changed only a little bit. Accordingly, the flow rate range of the carrier gas for the securement of good in-plane uniformity is narrow. This makes it difficult to regulate the in-plane uniformity.

The nozzle cover 5 is configured such that the raw material gas nozzle 31 is installed at the position adjacent to the second separating region D2. For that reason, the raw material gas is supplied from the rotation-direction upstream side of the first processing region P1. Accordingly, it is possible to prolong the contact time of the raw material gas and the wafers W and to sufficiently adsorb the raw material gas onto the wafers W. In the aforementioned example, the cleaning gas nozzle 71 is installed so as to supply the cleaning gas between the flow regulating plate portion 51 and the rotary table 2. Thus, the cleaning gas sufficiently spreads to the inside of the flow regulating plate portion 51. It is therefore possible to reliably remove the thin film adhered to the flow regulating plate portion 51 in the cleaning process.

Figure 11:
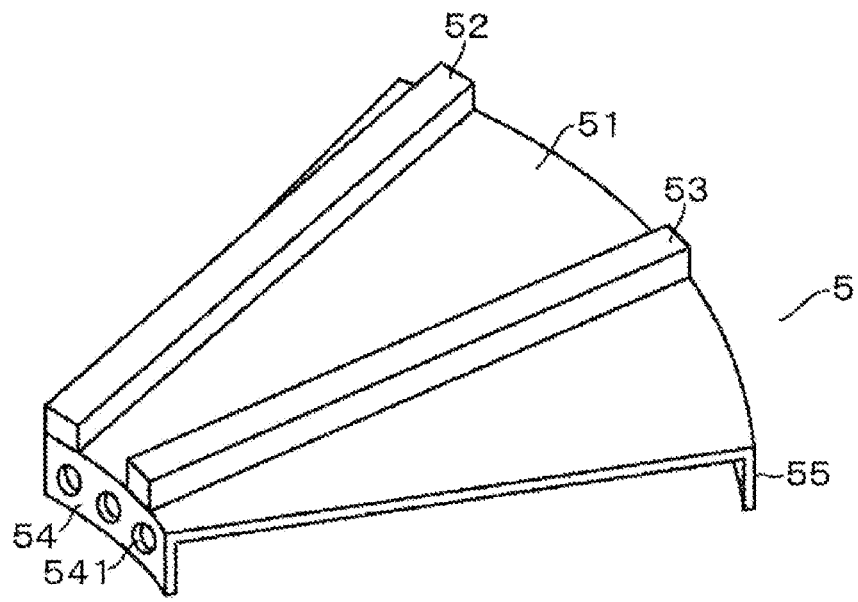
FIG. 11 is a schematic perspective view showing another example of the nozzle cover.

The shape and size of the flow regulating plate portion 51 and the protuberance portion 54 are not limited to the examples described above but may be set to make sure that, when the flow rate of the carrier gas for the wafers having a diameter of 300 mm is set to fall within a range of from 500 sccm to 1,000 sccm, the in-plane uniformity of the film thickness of the wafers becomes ±2.0% or less, or ±1.5% or less. Accordingly, as long as the in-plane uniformity can be secured, openings 541 may be formed at the protuberance portion 54 as shown in a schematic perspective view of FIG. 11. The shape of the openings 541 is not limited to the example shown in FIG. 11.

Figure 12:
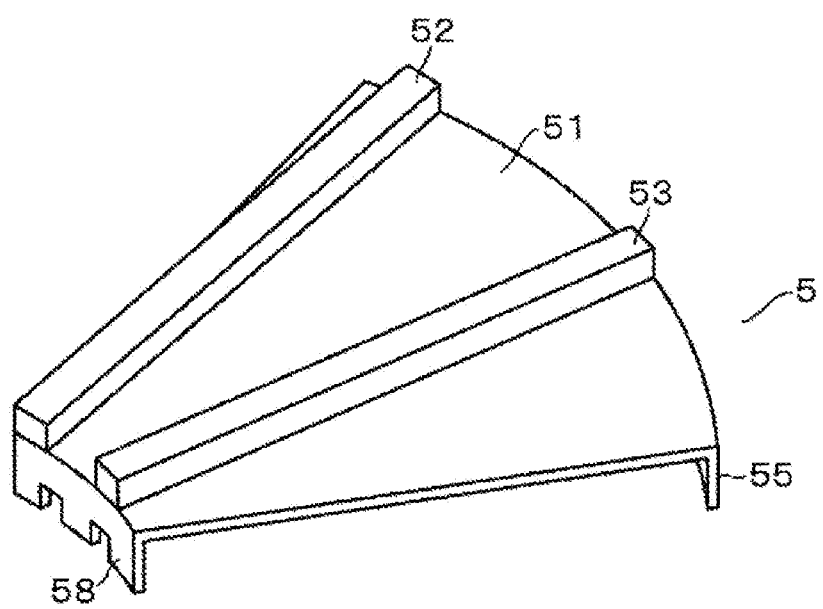
FIG. 12 is a schematic perspective view showing a further example of the nozzle cover.

As shown in FIG. 12, a protuberance portion 58 may be formed at a portion of the front end side of the flow regulating plate portion 51 in the circumferential direction. For example, a circle having a radius equal to the distance from the rotation center of the rotary table 2 to a center of the protuberance portion 58 in the radial direction of the rotary table 2 is drawn. At this time, a region where a separation distance between a lower surface of the protuberance portion 58 and the surface of the rotary table 2 ranges from 1.0 mm to 2.0 mm may be formed over a region whose length is 50% or more of the total length of the circle crossing the flow regulating plate portion 51. Even in this configuration, when the flow rate of the carrier gas is set to fall within a range of from 500 sccm to 1,000 sccm, the in-plane uniformity of the film thickness of the wafers becomes ±2.0% or less, or ±1.5% or less.

Figure 13:
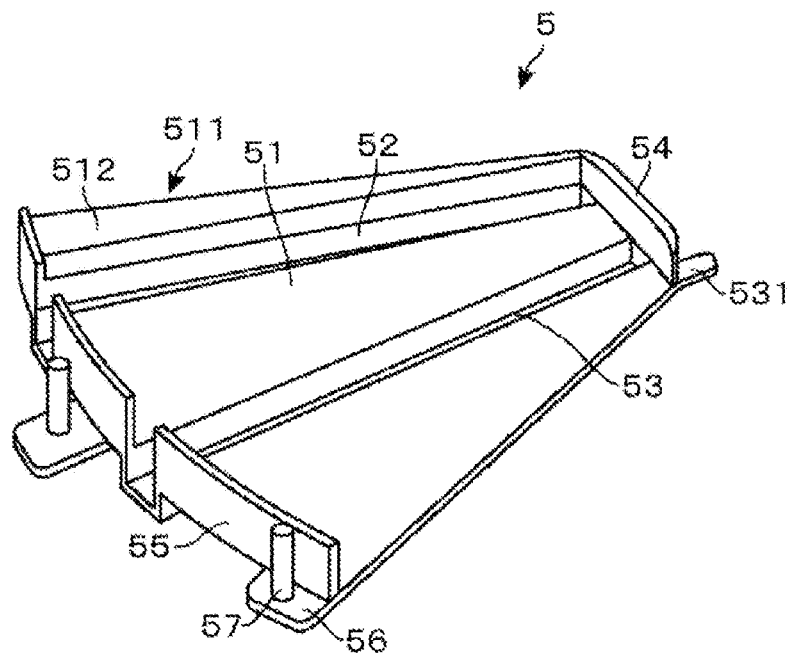
FIG. 13 is a schematic bottom perspective view showing a still further example of the nozzle cover.
Figure 14:
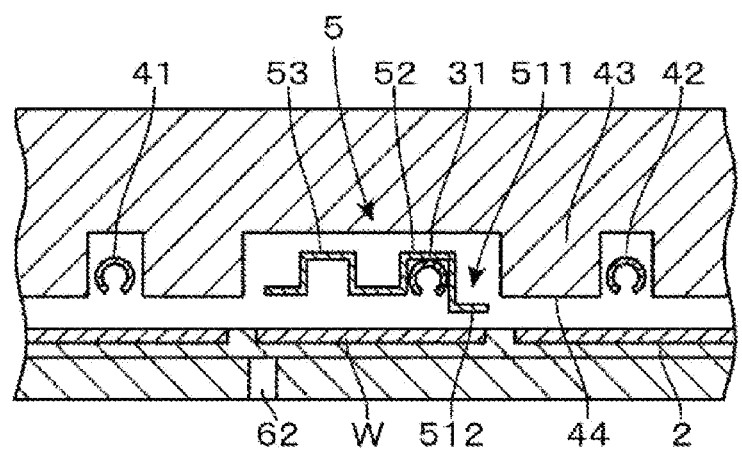
FIG. 14 is a vertical sectional side view showing a still further example (example shown in FIG. 13) of the nozzle cover.

Furthermore, as shown in FIGS. 13 and 14, the nozzle cover 5 may be configured to include an additional protuberance portion 511 in addition to the aforementioned protuberance portion 54 in order to restrain the separating gas supplied from the rotation-direction upstream side of the flow regulating plate portion 51 from flowing between the flow regulating plate portion 51 and the rotary table 2. The additional protuberance portion 511 is formed at a position shifted toward the rotation-direction upstream side from the raw material gas nozzle 31, so as to protrude from the flow regulating plate portion 51 toward the rotary table 2. In this example, the flow regulating plate portion 51 is formed in an L-like bent shape such that the flow regulating plate portion 51 extends from the rotation-direction upstream side of the raw material gas nozzle 31 to the downstream side of the raw material gas nozzle 31 and is then bent so as to form a horizontal face portion. Furthermore, an upper surface of the additional protuberance portion 511 is positioned lower than the lower surface (first ceiling surface) 44 of the protrusion portion 43 existing at the rotation-direction upstream side. For example, the separation distance between the lower surface 572 of the additional protuberance portion 511 and the surface of the rotary table 2 is set to 1.0 mm to 2.0 mm, e.g., 1.5 mm.

Thus, the gas supplied from the rotation-direction upstream side is guided by the upper surface of the additional protuberance portion 511 so as to rapidly flow toward an upper side of the additional protuberance portion 511. Thus, the gas is restrained from flowing between the flow regulating plate portion 51 and the rotary table 2. However, it is not always necessary that the entirety of the lower surface of the flow regulating plate portion 51 existing in the region shifted to the rotation-direction upstream side from the base portion 52 is caused to protrude downward. For example, if a protuberance portion protruding downward along the longitudinal direction of the base portion 52 is formed at the rotation-direction upstream side of the base portion 52, the inflow of the separating gas from the rotation-direction upstream side is suppressed. Openings may be formed at this protuberance portion.

Furthermore, the plane-view size of the flow regulating plate portion 51 may be set so as to become larger step by step toward the outer periphery of the rotary table 2. The cleaning gas nozzle 71 may not be installed below the flow regulating plate portion 51 but may be installed at a region differing from the region where the flow regulating plate portion 51 is disposed in the first processing region P1. The nozzle cover 5 described above can be applied to an apparatus in which two processing regions are separated by the separating region. Accordingly, the application of the nozzle cover 5 is not limited to the aforementioned film forming apparatus 1. For example, the film forming apparatus 1 may be configured to include a plasma generating unit for performing a modifying process with plasma in the second processing region P2.

Example

Evaluation Test 1

Figure 17:
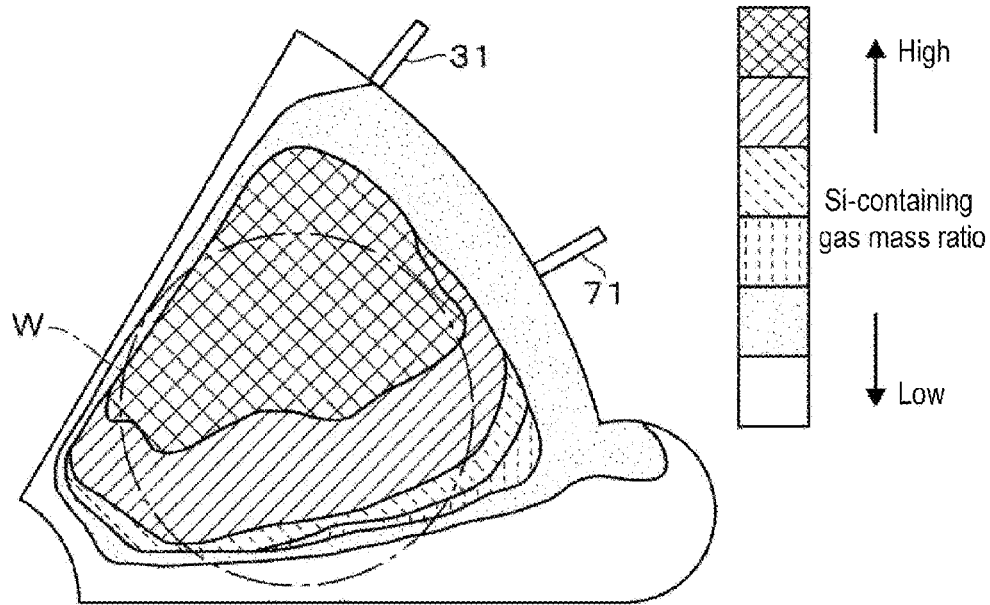
FIG. 17 is a schematic diagram showing a result of an evaluation test.

An evaluation test performed by simulating the film forming apparatus 1 according to the present disclosure will be described. In evaluation test 1, the mixed gas of the raw material gas and the carrier gas was discharged from the raw material gas nozzle 31 while rotating the rotary table 2 and performing the exhaust from the first vacuum exhaust port 62 as in the aforementioned embodiment. At this time, the gas concentration distribution and the mass ratio distribution in and around the first processing region P1 were simulated. During the discharge of the gas, the internal pressure of the vacuum container 11 was set to 891.1 Pa (6.7 Torr) and the internal temperature of the vacuum container 11 was set to 620 degrees C. A Si-containing gas composed of a 3DMAS gas was used as the raw material gas. The flow rate of the raw material gas was set to 300 sccm. Furthermore, the flow rate of the carrier gas was set to 500 sccm. The rotation speed of the rotary table 2 during the supply of the raw material gas was set to 120 rpm. The dimension of the nozzle cover 5 was set as mentioned above. The separation distance h2 between the lower surface of the protuberance portion 54 and the surface of the rotary table 2 was set to 1.5 mm. At the position shifted toward the outer periphery of the rotary table 2 from the protuberance portion 54, the separation distance h3 between the flow regulating plate portion 51 and the surface of the rotary table 2 was set to 3 mm (example 1). The concentration distribution of the Si-containing gas is shown in FIG. 16 and the mass ratio distribution of the Si-containing gas is illustrated in FIG. 17.

Figure 18:
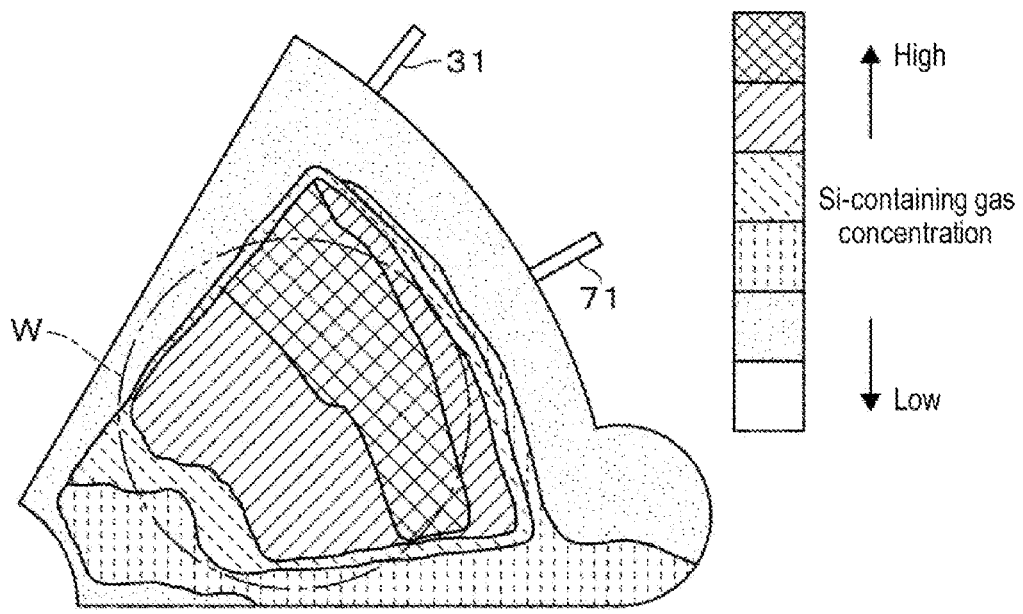
FIG. 18 is a schematic diagram showing a result of an evaluation test.
Figure 19:
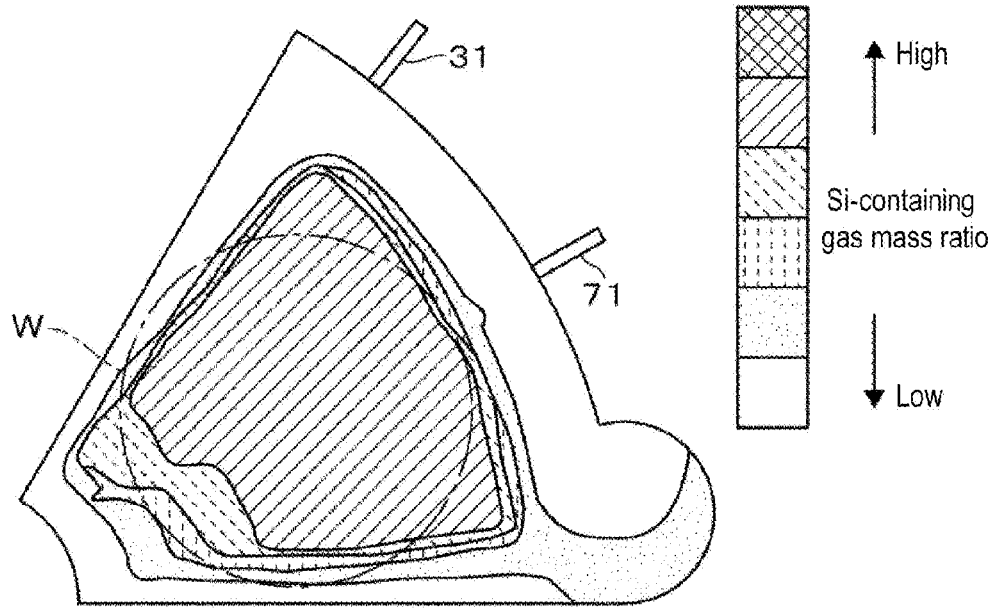
FIG. 19 is a characteristic diagram showing a result of an evaluation test.
Figure 20:
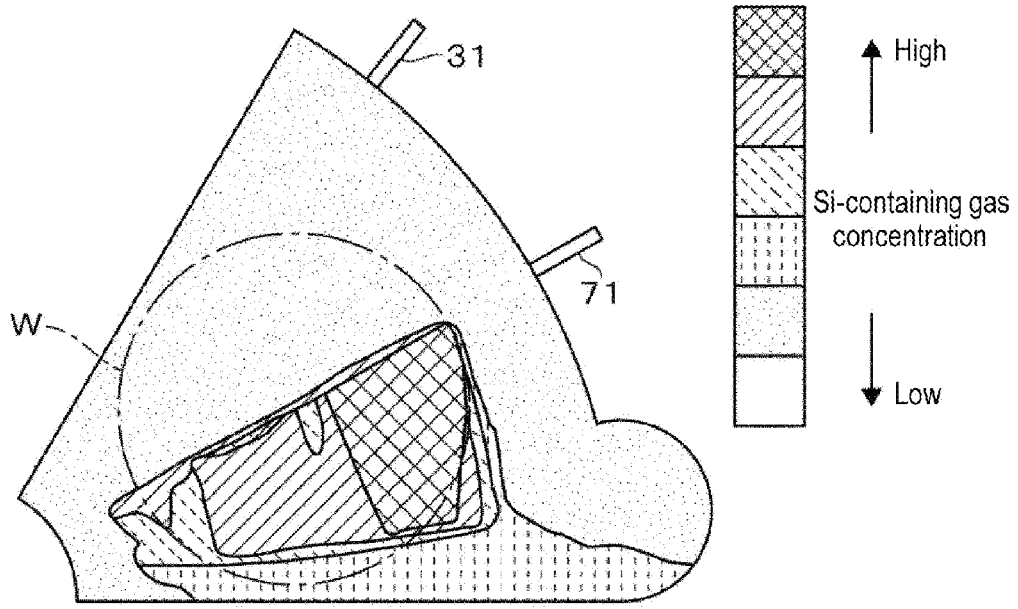
FIG. 20 is a schematic diagram showing a result of an evaluation test.
Figure 21:
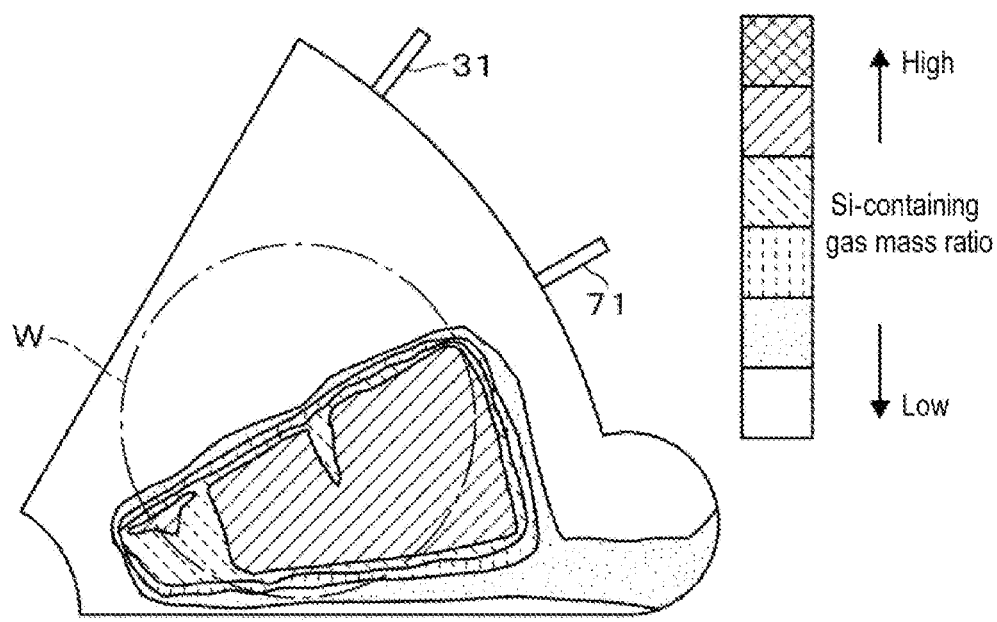
FIG. 21 is a schematic diagram showing a result of an evaluation test.

With respect to an apparatus employing a configuration (comparative example 1) in which the protuberance portion is not installed at the nozzle cover of example 1 and an apparatus employing a configuration (comparative example 2) in which, as shown in FIG. 15, the flow regulating plate portion is smaller in size than the nozzle cover of example 1 and the protuberance portion is not installed, the concentration distribution and the mass ratio distribution of the Si-containing gas were simulated in a similar manner. The gas concentration distribution in comparative example 1 is shown in FIG. 18 and the mass ratio distribution in comparative example 1 is shown in FIG. 19. Furthermore, the gas concentration distribution in comparative example 2 is shown in FIG. 20 and the mass ratio distribution in comparative example 2 is shown in FIG. 21.

As can be noted from the simulation results of the concentration distribution of the Si-containing gas (see FIGS. 16, 18 and 20), in the case of the nozzle cover 5 of example 1, it is recognized that the region where the gas concentration is high extends substantially over the entirety of the nozzle cover 5. It was confirmed that the raw material gas is filled at a high concentration over the entire surface of the nozzle cover 5. Thus, it is understood that the raw material gas is adsorbed with good in-plane uniformity, whereby the in-plane uniformity of the film thickness becomes high. On the other hand, in the case of comparative examples 1 and 2, it is recognized that the gas concentration is higher at the rear end side (peripheral edge side) of the nozzle cover than at the front end side thereof and further that the gas concentration distribution becomes uneven in the radial direction of the wafer W. Presumably, this is because, due to the absence of the protuberance portion, the separating gas supplied from the central region C flows into the nozzle cover, thereby generating an action of pushing the raw material gas back to the outer periphery side of the rotary table 2 and consequently establishing a state in which it is difficult for the raw material gas to spread toward the front end side (the center side of the rotary table).

As can be noted from the simulation result of the mass ratio distribution of the Si-containing gas (see FIGS. 17, 19 and 21), in case of the nozzle cover 5 of example 1, it is recognized that the region having a high mass ratio is increased and the mass ratio is uniform along the radial direction of the rotary table 2. From the simulation result, it is recognized that the raw material gas concentration in the radial direction of the rotary table 2 is made uniform by installing the protuberance portion 54 at the flow regulating plate portion 51 and suppressing the in-flow of the separating gas from the central region C. Thus, the effects of the present disclosure were confirmed.

Evaluation Test 2

SiO$_2$ films were formed by the film forming apparatus of the aforementioned embodiment while changing the flow rate of the carrier gas. The in-plane uniformity of the film thickness and the film forming rate were measured. A nozzle cover identical in configuration with that of example 1 was used as the nozzle cover 5. The film forming conditions are the same as the conditions of evaluation test 1 except for the flow rate of the carrier gas. The flow rate of the carrier gas (nitrogen gas) was changed within a range of from 300 sccm to 1,000 sccm. Then, the in-plane uniformity and the film forming rate were measured. The method of measuring the in-plane uniformity is the same as described above. Similar evaluation tests were conducted using the film forming apparatuses provided with the nozzle covers having the configurations of comparative examples 1 and 2.

Figure 22:
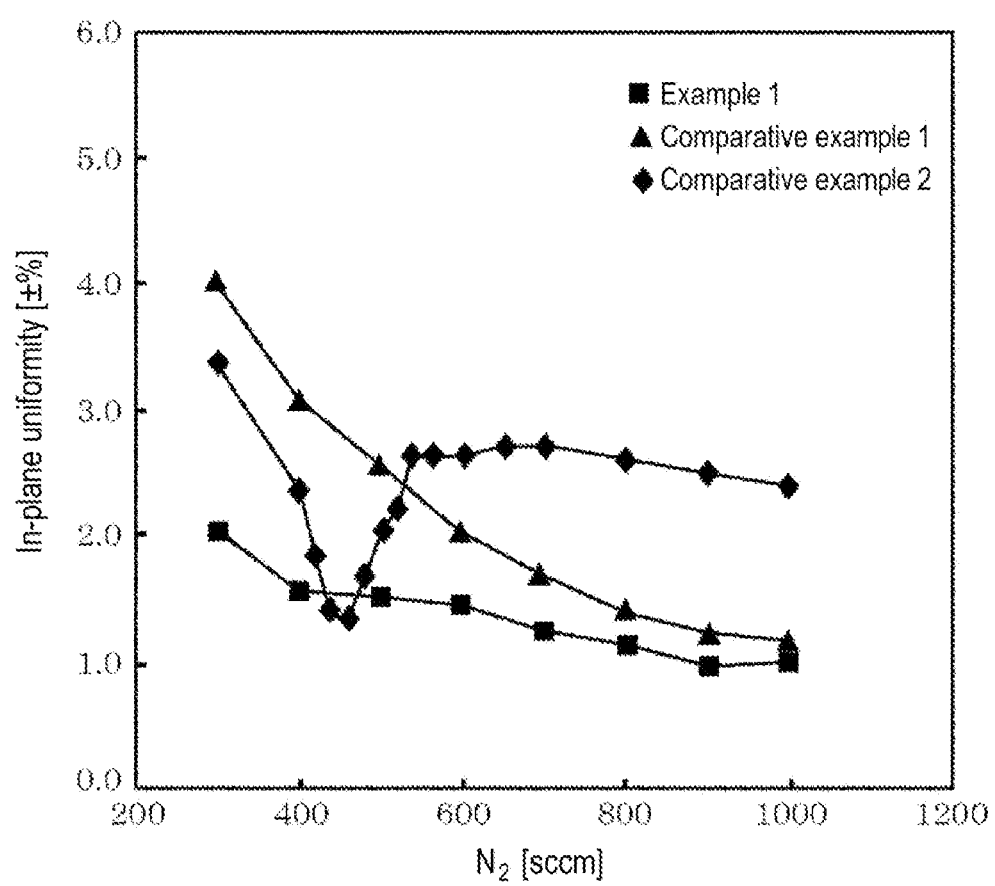
FIG. 22 is a schematic diagram showing a result of an evaluation test.
Figure 23:
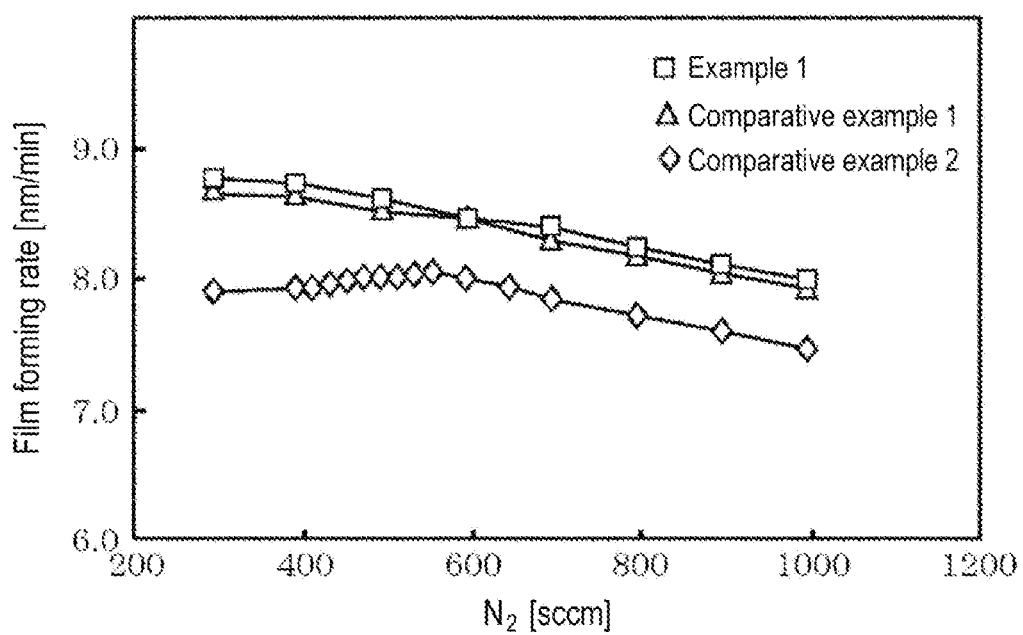
FIG. 23 is a characteristic diagram showing a result of an evaluation test.

Measurement results of the in-plane uniformity are shown in FIG. 22. In FIG. 22, a horizontal axis indicates the flow rate of the nitrogen gas (carrier gas) and a vertical axis indicates the in-plane uniformity. The measurement result of example 1 was plotted with ■. The measurement result of comparative example 1 was plotted with ▲. The measurement result of comparative example 2 was plotted with ◆. Furthermore, the measurement results of the film forming rate are shown in FIG. 23. In FIG. 23, a horizontal axis indicates the flow rate of the nitrogen gas (carrier gas) and a vertical axis indicates the film forming rate. The measurement result of example 1 was plotted with □. The measurement result of comparative example 1 was plotted with Δ. The measurement result of comparative example 2 was plotted with ◇.

From the simulation results of the in-plane uniformity shown in FIG. 22, it is recognized that the in-plane uniformity obtained with the nozzle cover of example 1 is superior to the in-plane uniformity obtained with the nozzle covers of comparative examples 1 and 2. Furthermore, in the case of using the nozzle cover of example 1, it is recognized that, when the flow rate of the carrier gas is set to fall within a range of from 400 sccm to 1,000 sccm, the in-plane uniformity of the film thickness of the wafer becomes ±2.0% or less. Furthermore, it is recognized that, when the flow rate of the carrier gas is set to fall within a range of from 500 sccm to 1,000 sccm, the in-plane uniformity of the film thickness of the wafer becomes ±1.5% or less. Thus, it is understood that high in-plane uniformity can be obtained over a wide range of carrier gas flow rate.

In the case of using the nozzle cover of comparative example 1, it is recognized that, when the flow rate of the carrier gas is low, the in-plane uniformity is ±4%. Furthermore, it is recognized that, as the flow rate of the carrier gas increases, the in-plane uniformity grows higher. In the case of using the nozzle cover of comparative example 2, it is confirmed that, when the flow rate of the carrier gas is about 450 sccm, the in-plane uniformity becomes superior and further that, when the flow rate of the carrier gas is set to other values, the in-plane uniformity is sharply reduced and the change in the in-plane uniformity with respect to the change amount of the carrier gas flow rate is steep.

Comparative example 2 is directed to the configuration of the nozzle cover used in the related art. From the result of comparative example 2, it is understood that the in-plane uniformity depends largely on the flow rate of the carrier gas and further that a difficulty is involved in balancing the in-flow amount of the separating gas supplied from the central region C and the discharge amount of the raw material gas in the longitudinal direction of the raw material gas nozzle 31 pursuant to the flow rate of the carrier gas. The flow rate range of the carrier gas capable of securing high in-plane uniformity is extremely narrow. The in-plane uniformity is sensitive to the change in the flow rate of the carrier gas. Thus, when one attempts to regulate the in-plane uniformity using the flow rate of the carrier gas, it is necessary to finely regulate the flow rate on a 10 cc unit basis. For that reason, the regulation of the in-plane uniformity becomes onerous.

From the measurement results of the film forming rate shown in FIG. 23, it is recognized that the film forming rate obtained with the nozzle cover of example 1 is higher than the film forming rate obtained with the nozzle cover of comparative example 2. It is also recognized that the film forming rates obtained with the nozzle covers of example 1 and comparative example 1 are substantially equal to each other. It is further recognized that the film forming rate becomes higher as the flow rate of the carrier gas grows smaller.

From the results mentioned above, it is recognized that, by employing the configuration in which the plane-view size of the flow regulating plate portion 51 of the nozzle cover is made large and the protuberance portion 54 is installed at the front end portion thereof as in example 1, the film forming process can be performed with high in-plane uniformity over a wide carrier gas flow rate range of from 300 sccm to 1,000 sccm. It is also recognized that the film forming rate is improved. Even in the configuration of comparative example 1, high in-plane uniformity can be obtained by increasing the flow rate of the carrier gas. However, it is understood that, if the flow rate of the carrier gas is increased, the film forming rate is reduced. Thus, the increase of the flow rate of the carrier gas is inadvisable.

According to the present disclosure, when forming a film by rotating a rotary table within a vacuum container and causing a substrate mounted on the rotary table to sequentially pass through a supply region of a raw material gas and a supply region of a reaction gas reacting with a raw material, a central region is formed to supply a separating gas from the center side within the vacuum container, thereby separating the supply region of the raw material gas and the supply region of the reaction gas from each other. Furthermore, a flow regulating plate portion is installed so as to extend along the longitudinal direction of a raw material gas nozzle at the rotation-direction upstream and downstream sides of the raw material gas nozzle. The protuberance portion is installed to protrude from the flow regulating plate portion toward the rotary table. Due to the installation of the protuberance portion, the separating gas supplied from the central region is restrained from flowing between the flow regulating plate portion and the rotary table. The mixed gas of the raw material gas and the carrier gas is supplied from the raw material gas nozzle. Since the in-flow of the separating gas supplied from the central region is suppressed, the raw material gas spreads toward the rotary table center side of the flow regulating plate portion regardless of the flow rate of the carrier gas. This makes it possible to obtain good in-plane uniformity over a broad range of carrier gas flow rate. Thus, the in-plane uniformity can be easily regulated by the flow rate of the carrier gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a film by rotating a rotary table to cause a substrate loaded on the rotary table to sequentially pass through a first processing region in which a raw material is adsorbed to the substrate and a second processing region in which the raw material is reacted with a reaction gas, the film forming apparatus comprising:
   a vacuum container including a top plate below which the rotary table is installed, the top plate including:
      an annular convex portion protruding downward from a central portion of the top plate; and
      fan-shaped first and second protrusion portions protruding downward from the top plate and connected to the annular convex portion, the first protrusion portion and the second protrusion portion being spaced apart from each other in a circumferential direction of the top plate and forming a first space and a second space, which are spaced apart from each other in the circumferential direction, between the first protrusion portion and the second protrusion portion;
   a raw material gas nozzle installed in the first space and configured to discharge a raw material gas toward the rotary table so as to form the first processing region below the first space;
   a cleaning gas nozzle installed in the first space and configured to discharge a cleaning gas toward the rotary table;
   a reaction gas nozzle installed in the second space and configured to discharge the reaction gas toward the rotary table so as to form the second processing region below the second space;
   a separating gas supply pipe configured to supply a separating gas to the annular convex portion so as to separate the first processing region and the second processing region from each other;
   a first separating gas nozzle installed in the first protrusion portion and configured to discharge the separating gas toward the rotary table so as to form a first separating region, which separates the first processing region and the second processing region from each other, below the first protrusion portion;
   a second separating gas nozzle installed in the second protrusion portion and configured to discharge the separating gas toward the rotary table so as to form a second separating region, which separates the first processing region and the second processing region from each other, below the second protrusion portion;
   an exhaust port configured to vacuum exhaust an interior of the vacuum container; and
   a fan-shaped flow regulating plate portion installed in the first space, the flow regulating plate portion including:
      a first base portion protruding upward from the flow regulating plate portion and extending along a longitudinal direction of the raw material gas nozzle, the base portion having a U-like cross-sectional shape such that an upper side and a lateral side of the raw material gas nozzle are covered with the first base portion;
      a second base portion protruding, at a downstream side of the first base portion in a rotation direction of the rotary table, upward from the flow regulating plate portion and extending along the longitudinal direction of the cleaning gas nozzle, the second base portion having a U-like cross-sectional shape such that an upper side and a lateral side of the cleaning gas nozzle are covered with the second base portion; and
      a protuberance portion protruding downward from the flow regulating plate portion at a position closer to the annular convex portion than the raw material gas nozzle so as to restrain the separating gas supplied to the annular convex portion from flowing into a space between the flow regulating plate portion and the rotary table.

2. The apparatus of claim 1, wherein a gas inlet of the raw material gas nozzle is positioned at a peripheral edge side of the vacuum container.

3. The apparatus of claim 1, wherein a separation distance between the protuberance portion and the rotary table is from 1.0 mm to 2.0 mm.

4. The apparatus of claim 1, wherein the protuberance portion has a first region where a separation distance between the protuberance portion and a surface of the rotary table ranges from 1.0 mm to 2.0 mm and a second region where the separation distance is larger than in the first region, and a ratio between a length of a surface of the first region in the rotation direction of the rotary table and a total length of the surface of the first region and a surface of the second region in the rotation direction of the rotary table is 50% or more.

5. The apparatus of claim 1, wherein, at a position shifted toward an outer periphery of the rotary table from the protuberance portion, a separation distance between the flow regulating plate portion and a surface of the rotary table is from 2.0 mm to 4.0 mm.

6. The apparatus of claim 1, further comprising:
an additional protuberance portion configured to restrain the separating gas supplied from the rotation-direction upstream side of the flow regulating plate portion from flowing between the flow regulating plate portion and the rotary table, the additional protuberance portion protruding from the flow regulating plate portion toward the rotary table at a position shifted from the raw material gas nozzle toward the rotation-direction upstream side of the raw material gas nozzle.

7. The apparatus of claim 1, wherein the flow regulating plate portion is stepwise or continuously widened as the flow regulating plate portion extends toward an outer periphery of the rotary table.

8. The apparatus of claim 1, wherein gas discharge holes, which intersect in the rotation direction of the rotary table and discharge a mixed gas of the raw material gas and a carrier gas, are formed in the raw material gas nozzle along the longitudinal direction of the raw material gas nozzle.

9. The apparatus of claim 8, wherein the substrate is a wafer having a diameter of 300 mm, and
wherein, when the flow rate of the carrier gas is set to fall within a range of from 500 cc/min to 1,000 cc/min and when the film thickness of the wafer is measured at 49 points within a plane of the wafer, an in-plane uniformity is +2.0% or less.

10. The apparatus of claim 1, wherein the cleaning gas nozzle is further configured to supply the cleaning gas to a space between the flow regulating plate portion and the rotary table.

* * * * *